(12) United States Patent
Soukhostavets

(10) Patent No.: US 10,360,318 B2
(45) Date of Patent: Jul. 23, 2019

(54) SYSTEM AND METHOD FOR MULTI-DOMAIN GRAPHICAL MODELING

(71) Applicant: PRATT & WHITNEY CANADA CORP., Longueuil (CA)

(72) Inventor: Valeri Soukhostavets, Brossard (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 969 days.

(21) Appl. No.: 14/492,309

(22) Filed: Sep. 22, 2014

(65) Prior Publication Data

US 2016/0085888 A1  Mar. 24, 2016

(51) Int. Cl.
G06F 17/50  (2006.01)

(52) U.S. Cl.
CPC ............................. G06F 17/5009 (2013.01)

(58) Field of Classification Search
None
See application file for complete search history.

(56) References Cited

U.S. PATENT DOCUMENTS

| | | | |
|---|---|---|---|
| 7,831,418 B1 * | 11/2010 | Sendhoff | G06F 17/5095 700/29 |
| 8,365,141 B1 | 1/2013 | Yan | |
| 8,397,214 B2 | 3/2013 | Hudson, III et al. | |
| 8,543,976 B1 | 9/2013 | Ghosh-Roy et al. | |
| 8,577,652 B2 | 11/2013 | Oh | |
| 9,330,211 B2 * | 5/2016 | Papariello | G06F 9/455 |
| 2002/0046009 A1 * | 4/2002 | Devaquet | G05B 17/02 703/1 |
| 2015/0149134 A1 * | 5/2015 | Mehta | G06F 17/5009 703/6 |
| 2016/0078648 A1 | 3/2016 | Gagnon et al. | |

* cited by examiner

Primary Examiner — Craig C Dorais
(74) Attorney, Agent, or Firm — Norton Rose Fulbright Canada LLP

(57) ABSTRACT

Modeling of a physical system encompassing a plurality of physical domains and comprising a multi-domain physical component participating in a process of a first and at least a second physical domain is provided. A first block representing the multi-domain physical component in a first hierarchical level modeling the first physical domain and at least one second block representing the first block in at least one second hierarchical level modeling the at least second physical domain are provided in a hierarchically-arranged block diagram model representative of the physical system. The at least one second block is connected to at least one of one or more third blocks provided at the at least one second hierarchical level and receives first information therefrom and is linked to the first block for transmitting the first information to the first block and transmitting second information from the first block to the third blocks.

20 Claims, 15 Drawing Sheets

SYSTEM AND METHOD FOR MULTI-DOMAIN GRAPHICAL MODELING

TECHNICAL FIELD

The application relates generally to graphical modeling of multi-domain physical systems.

BACKGROUND OF THE ART

Physical systems, examples of which include fluid systems of engines, are typically modeled to predict selected physical variables, such as mass flow rates, pressures, temperatures, and two-phase mixtures quality, for physical components of the systems. Such physical systems may be large and complex and require modeling of multi-domain physical processes (e.g. flow, thermal, mechanical, electrical, control . . . ).

Graphical computer modeling environments and tools are typically used to allow users to build models of physical systems as networks of connected blocks. However, using conventional graphical modeling environments, additional ports generally need to be implemented to build multi-domain blocks. For instance, in order to enable a hydraulic restrictor having two flow ports to provide heat transfer to other blocks in the model, at least one additional port would need to be created for the restrictor block. Creating additional connection ports and connection lines for multi-domain connection has the drawback of yielding complex graphical networks, which are difficult to create, read, check, and modify and become unmanageable for large physical systems. This becomes even more problematic when there is a need to model physical systems comprising multi-domain blocks that are located at a great distance from one another or in different subsystems.

There is therefore a need for an improved system and method for graphical modeling of physical systems.

SUMMARY

In one aspect, there is provided a computer-implemented method for modeling a physical system in a graphical environment, the physical system encompassing a plurality of physical domains and comprising at least one multi-domain physical component participating in a process of a first one and at least a second one of the plurality of physical domains. The method comprises providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and linking the at least one second block to the first block for transmitting the first information from the at least one second block to the first block and transmitting second information from the first block to the one or more third blocks.

In another aspect, there is provided a system for modeling a physical system in a graphical environment, the physical system encompassing a plurality of physical domains and comprising at least one multi-domain physical component participating in a process of a first one and at least a second one of the plurality of physical domains. The system comprises a memory; a processor; and at least one application stored in the memory and executable by the processor for providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and linking the at least one second block to the first block for transmitting the first information from the at least one second block to the first block and transmitting second information from the first block to the one or more third blocks.

In a further aspect, there is provided a computer readable medium having stored thereon program code executable by a processor for modeling a physical system in a graphical environment, the physical system encompassing a plurality of physical domains and comprising at least one multi-domain physical component participating in a process of a first one and at least a second one of the plurality of physical domains. The program code is executable for providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and linking the at least one second block to the first block for transmitting the first information from the at least one second block to the first block and transmitting second information from the first block to the one or more third blocks.

DESCRIPTION OF THE DRAWINGS

Reference is now made to the accompanying figures in which:

FIG. 5b is a schematic diagram of a flow element of FIG. 5a;

DETAILED DESCRIPTION

Figure 1:
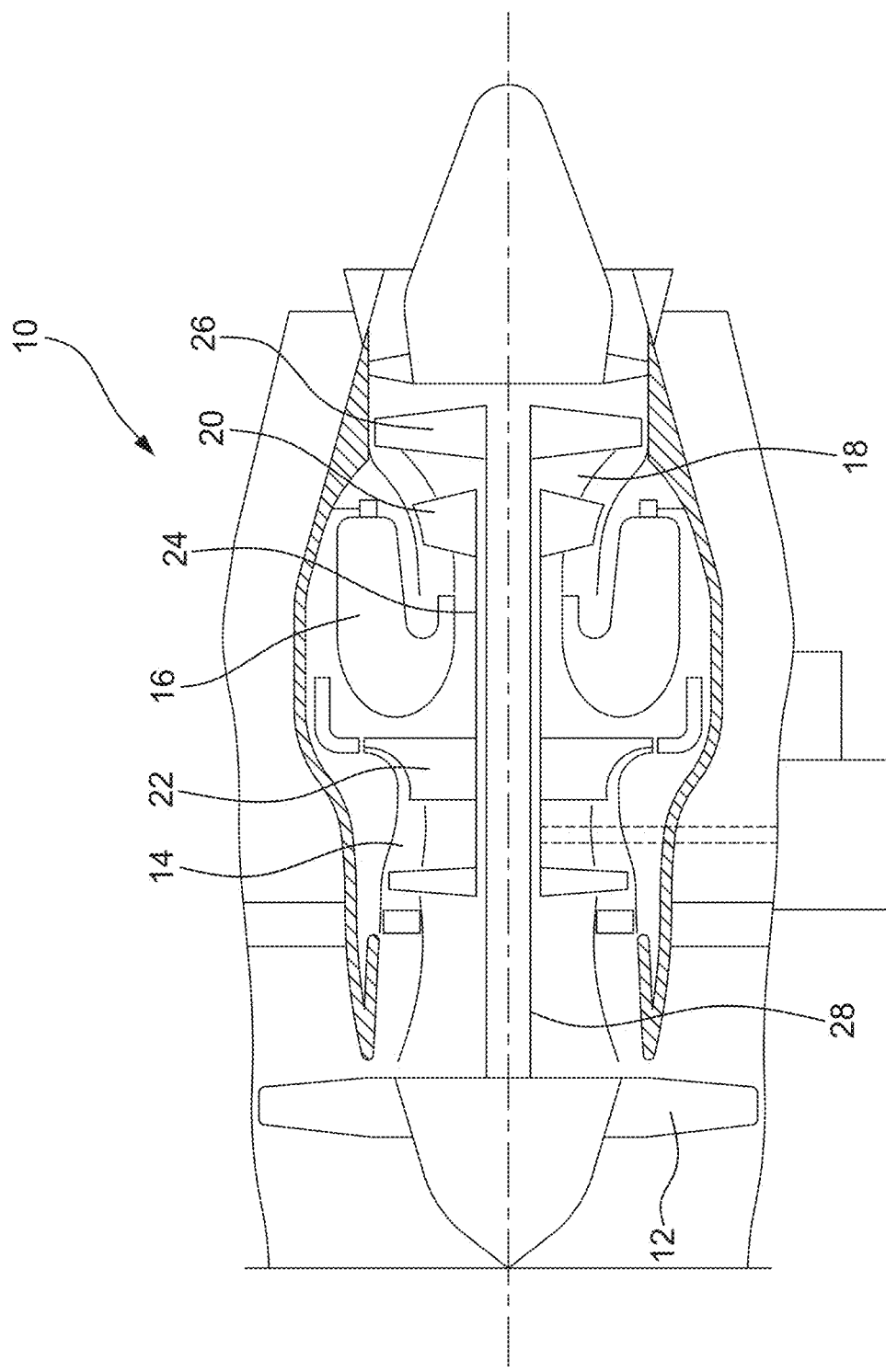
FIG. 1 is a schematic cross-sectional view of a gas turbine engine.

FIG. 1 illustrates a gas turbine engine 10 of a type preferably provided for use in subsonic flight, generally comprising in serial flow communication a fan 12 through which ambient air is propelled, a compressor section 14 for pressurizing the air, a combustor 16 in which the compressed air is mixed with fuel and ignited for generating an annular stream of hot combustion gases, and a turbine section 18 for extracting energy from the combustion gases. High pressure rotor(s) 20 of the turbine section 18 are drivingly engaged to high pressure rotor(s) 22 of the compressor section 14 through a high pressure shaft 24. Low pressure rotor(s) 26 of the turbine section 18 are drivingly engaged to the fan rotor 12 and to other low pressure rotor(s) (not shown) of the compressor section 14 through a low pressure shaft 28 extending within the high pressure shaft 24 and rotating independently therefrom.

Although illustrated as a turbofan engine, the gas turbine engine 10 may alternatively be another type of engine, for example a turboshaft engine, also generally comprising in serial flow communication a compressor section, a combustor, and a turbine section, and a fan through which ambient air is propelled. A turboprop engine may also apply.

Figure 2:
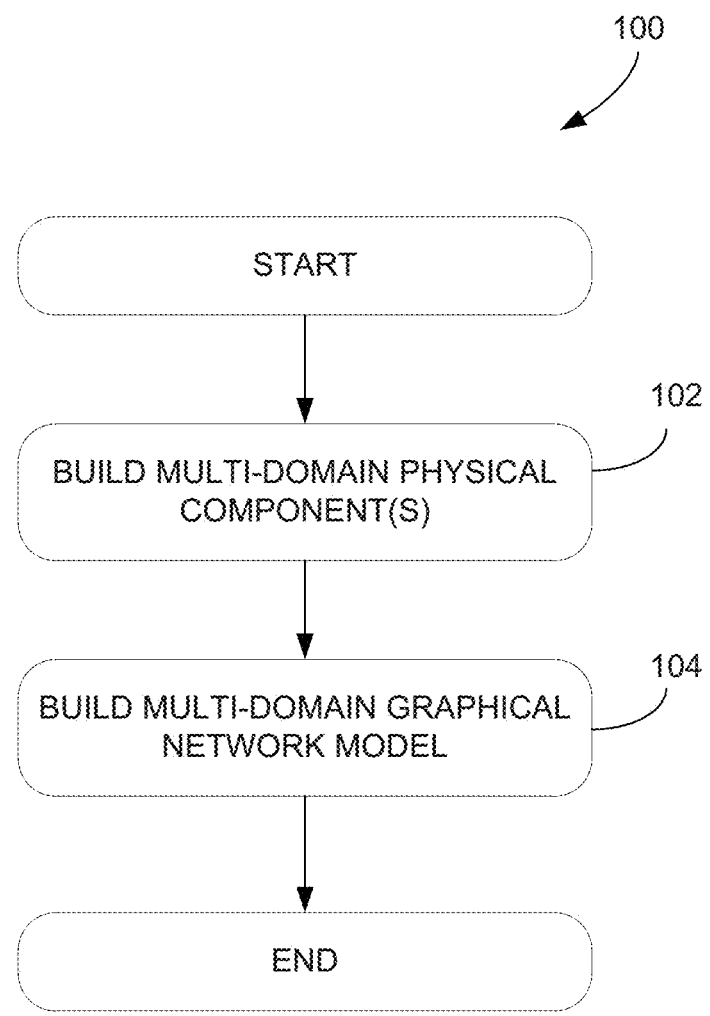
FIG. 2 is a flowchart of a method for multi-domain graphical modeling, in accordance with one embodiment.

Referring now to FIG. 2, a method 100 for multi-domain graphical modeling will now be described. The method 100 can be used to build a model of a dynamic physical system, such as that of the engine 10 of FIG. 1, as networks of interconnected blocks (e.g. block diagrams). For example, a physical system of the engine 10, such as a fluid system, a control system, or the like, may be modeled, for the purpose of simulation and/or analysis, using a suitable graphical modeling environment. For this purpose, a graphical representation of a mathematical model of the physical system, with blocks in the model being connected through signals passing between connected blocks to mimic physical connections in the system, can be created. One type of graphical modeling environment (e.g. Simulink® from The MathWorks, Inc., LabView, System View, Signal Processing Workstation, HyperSignal, etc.) may allow to build signal-based networks that represent mathematical models of the physical systems. Another type of graphical modeling environment (e.g. Dymola, MapleSim, SimMechanics, SimDriveline, SimHydraulics, SimPowerSystems, etc.) may allow to build physically connected networks that represent physical structures of modelled systems. Hybrid models may also be created by using several graphical modeling environments, for example by combining the control system model created in Simulink® with the hydraulic system model created in Simhydraulics. The networks may be created using components readily available in libraries of the commercial graphical modeling tools. A model (i.e. a graphical representation of a physical system) built according to the method 100 may further use all available features and functionalities of the graphical modeling environment. Although an engine system is referred to herein for illustrative purposes, it should be understood that the method 100 and system for multi-domain graphical modeling described herein may apply to a variety of physical systems other than that of an engine.

Using the method 100 and system described further below, physical systems with multi-domain physical processes (e.g. flow, thermal, mechanical, electrical, control, etc.) can be modeled. Such physical systems illustratively span multiple (e.g. at least two) physical domains (e.g. flow, thermal, mechanical, electrical, etc.), each domain having at least one physical property and comprising various interconnected physical components that participate in a process of the domain according to the at least one property (e.g. obey at least one physical law). In such multi-domain systems, one or more physical components (referred to herein as multi-domain physical components) may belong to (and therefore participate in a process of) more than one physical domain. For example, a DC motor, which involves both the electrical and the mechanical physical domains, or a hydraulic cylinder may cross multiple physical domains.

The method 100 illustratively comprises creating at step 102 a representation of one or more multi-domain physical components in the computer graphical modeling environment. Once the physical component(s) are created in the graphical environment, the next step 104 may then be to build a multi-domain graphical network model that is a representation of the physical system. The model may be built by interconnecting the representations (e.g. blocks) of the multi-domain physical components, as built at step 102, with one or more blocks from the built-in model library of the graphical modeling environment. The model library blocks may be used to create a representation of blocks that belong to a single physical domain. The model library blocks may also comprise common source blocks from which signals (e.g. speed shaft measurement) may be received or sink blocks to which signals may be output (e.g. for displaying signals generated during simulation). As known to those skilled in the art, steps 102 and 104 may be performed by a user interacting (e.g. moving graphical model components onto, editing, annotating, saving, printing, etc.) with a graphical user interface, such as a window presented on a display device (e.g. a screen), via suitable input/output devices, such as a mouse or keyboard (not shown). Once the model has been built, an execution engine may then execute or simulate the model to trace system outputs as a function of time.

Figure 3:
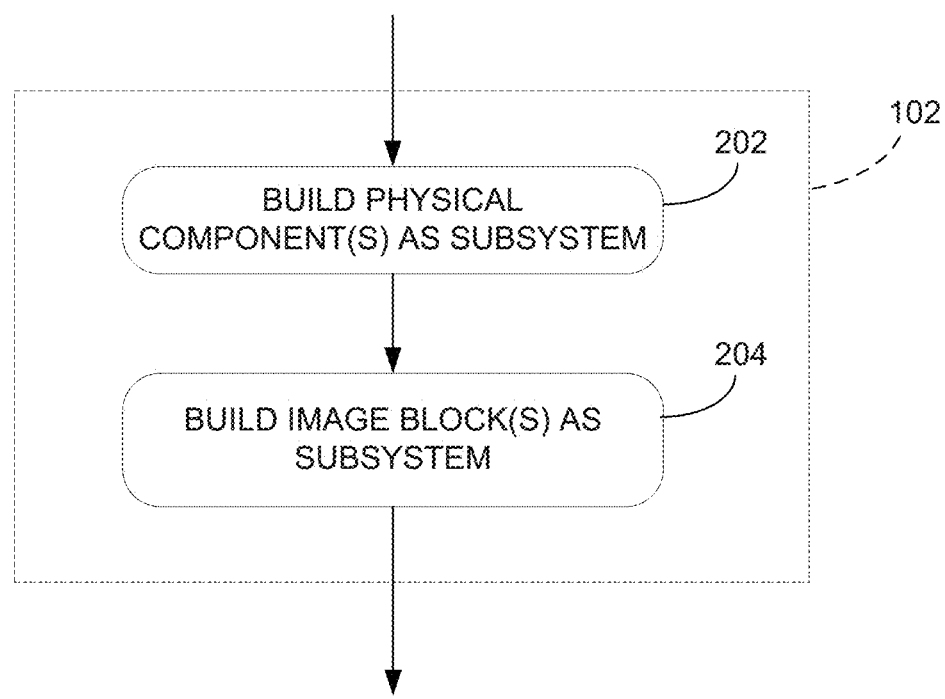
FIG. 3 is a flowchart of the step of FIG. 2 of building multi-domain physical component(s)

Referring to FIG. 3, the step 102 illustratively comprises building at step 202 each of the multi-domain physical component(s) as a subsystem block, e.g. a masked subsystem having memory allocated thereto, referred to herein as a physical component subsystem or physical component subsystem block. It should be understood that unmasked subsystems may also apply. The next step 204 is then to build, for each multi-domain block built at step 202, one or more image blocks each as a subsystem block, referred to herein as an image block. As will be discussed further below, more than one image block may be built for each multi-domain block. Although the description refers to image blocks being created for a physical component subsystem block, it should be understood that an image block may be created for any block provided in the model, whether a physical component block of the custom type or a standard block from the graphical modeling environment library. Each image block created at step 204 is a representation of a corresponding multi-domain block (referred to herein as the original multi-domain block) and may be located in a hierarchical level (e.g. a sub-layer) of the model other than the level in which the original multi-domain block is present, each hierarchical level being representative of a given physical domain of the physical system. A user may then interact with the graphical user interface to navigate to the original block from a given image block and perform any suitable operations on the image block(s) (e.g. edit or delete the image block). Upon performing steps 202 and 204, a library of custom blocks that could be reused in a variety of models and for various applications may be created.

Figure 4A:
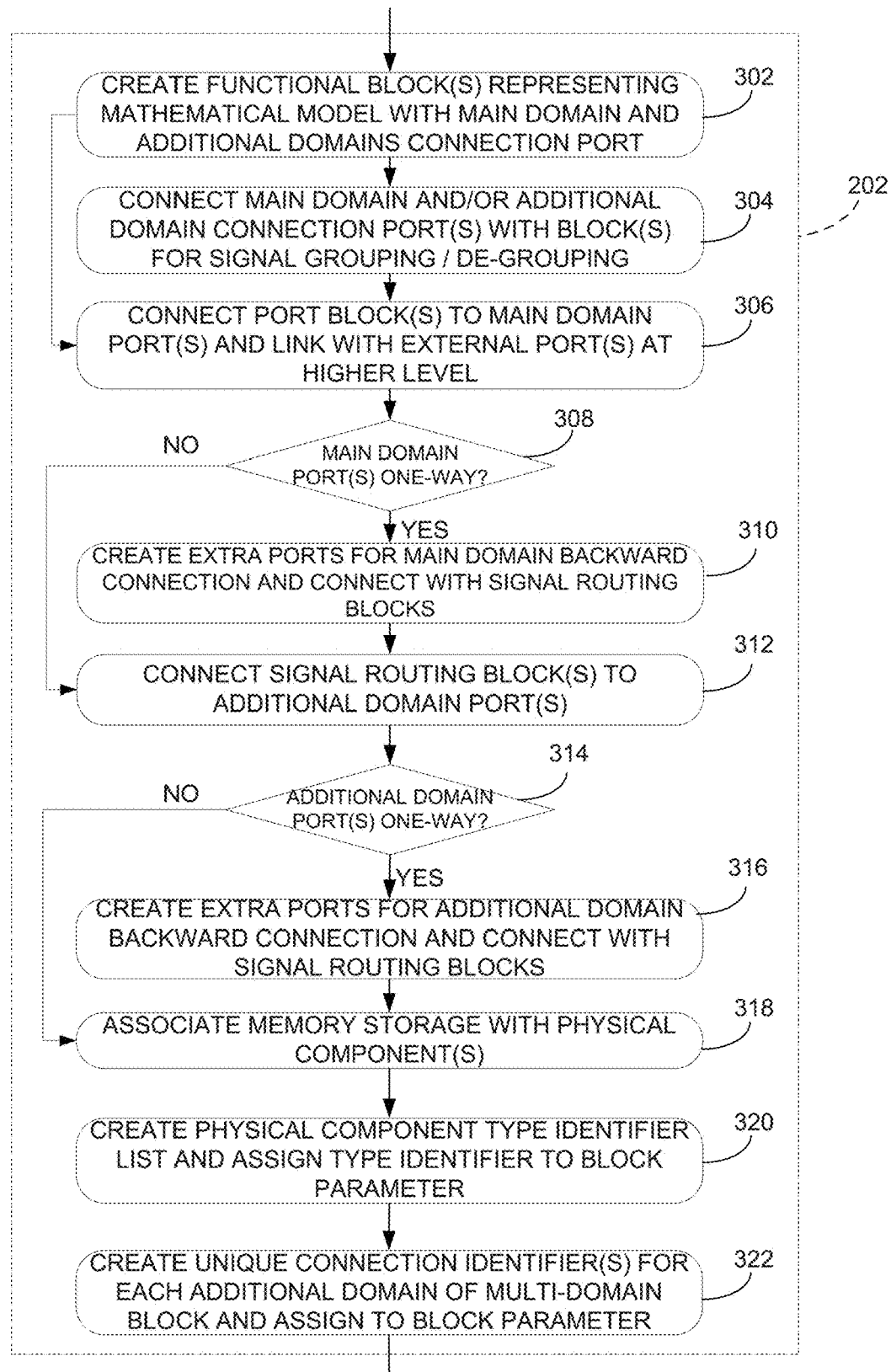
FIG. 4a is a flowchart of the step of FIG. 3 of building physical component(s) as subsystem.
Figure 4B:
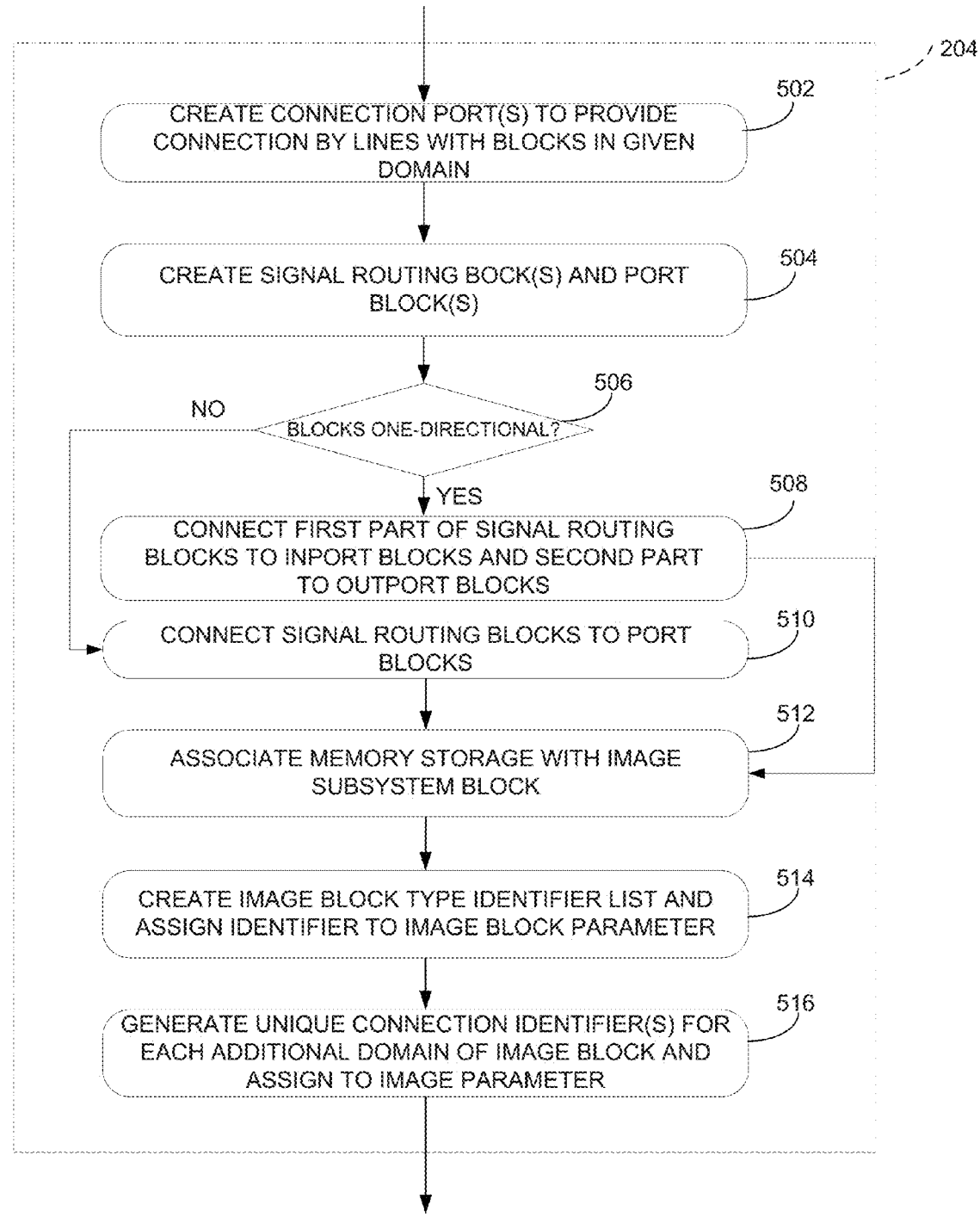
FIG. 4b is a flowchart of the step of FIG. 3 of building image block(s) as subsystem.
Figure 5A:
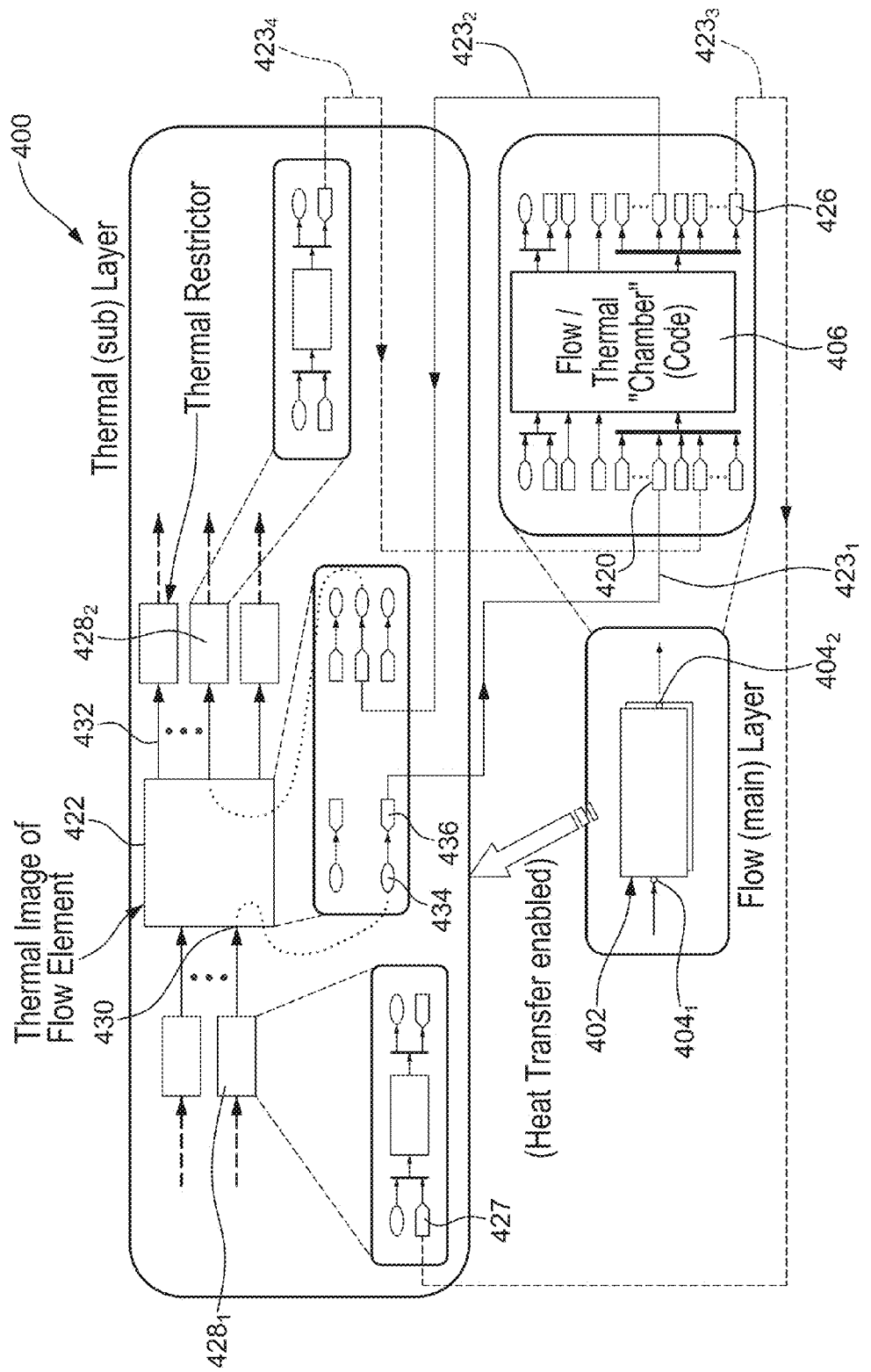
FIG. 5a is a schematic diagram illustrating the establishment of heat transfer between a flow layer and a thermal layer using components with one-way signal propagation capability, in accordance with one embodiment.

Referring now to FIG. 4a and FIG. 5a, the step 202 of building a multi-domain physical component as a subsystem will now be described. The step 204 of building an image block as a subsystem will be discussed further below with reference to FIG. 4b. Step 202 illustratively comprises creating at step 302 one or more functional blocks representing the physical component's mathematical model. This may be achieved using S-Functions from Simulink®. When created, the physical component subsystem (and similarly the image block discussed further below) is illustratively provided (e.g. represented by an icon) at a first layer of the graphical model while the one or more functional blocks comprising the physical component subsystem block (or the image block) are provided at another layer of the model, e.g. at a lower hierarchical level than the first layer. In this manner, using masked subsystems, functionally related blocks for a given physical component subsystem block can be kept together while the number of blocks displayed within a given window can be reduced by allowing internal components of a given physical component subsystem block to be presented in a window separate from the main window in which the given physical component subsystem block can be viewed.

One or more main domain connection ports and one or more additional domains connection ports may further be created and associated with the functional block(s) created for a given physical component subsystem block. The main domain and additional domain connection ports are illustratively internal ports of the functional block. For a given physical component subsystem block provided at a given hierarchical level of the graphical environment, the given hierarchical level representative of a first or main physical domain the corresponding physical component belongs to, the main domain connection ports illustratively enable connection between the physical component subsystem block and other blocks provided at the given hierarchical level. The additional domain connection ports in turn enable establishment of a connection between an image of the physical component subsystem block and blocks provided at other hierarchical levels than the given hierarchical level, as will be discussed further below.

The main domain connection ports may comprise main domain input ports and/or main domain output ports provided at the input and/or at the output of the functional block(s), respectively, while the additional domain connection ports may comprise additional domain input ports and/or additional domain output ports also provided at the input and/or at the output of the functional block(s), respectively. In some embodiments, one or more of the main domain and the additional domain input ports may be connected at step 304 to blocks for signal grouping (e.g. Mux blocks) and one or more of the main domain and the additional domain output ports may be connected de-grouping (e.g. Demux blocks). It should be understood that, depending on the number of main domain connection ports and additional domain connection ports, blocks for signal grouping or de-grouping may not need to be provided. Indeed, depending on the desired modeling, signal grouping/de-grouping blocks may be used to allow flexibility in the model as some functional blocks others only allow one (1) and would thus necessitate signal grouping/de-grouping for added functionality. In other embodiments where functional blocks allow several inputs/outputs, signal grouping/de-grouping may not be needed and the main domain and additional domain connection ports may then be connected directly to the functional block without connecting to a signal grouping/de-grouping block.

Port blocks, comprising input port blocks and output port blocks, may then be connected at step 306 to the main domain ports. Each port block may be represented in the graphical modeling environment by an Inport Simulink® block or an Outport Simulink® block. It should however be understood that other graphical modeling environments may apply and accordingly other embodiments may apply for implementing the port blocks. The input port blocks are illustratively connected to the main domain input ports and the output port blocks to the main domain output ports. It should be understood that, depending on the modeling to be achieved, port blocks may be connected to any number of the main domain connection ports. The port blocks may then be linked to external ports of the physical component subsystem block, the external ports being provided at the hierarchical level higher than the level at which components of the masked subsystem, e.g. the functional block(s), are located and allowing the physical component subsystem block to receive information from and/or output information to (e.g. via connection lines) other blocks arranged at the higher hierarchical level. It should be understood that two blocks may be connected via their external ports using any suitable connections other than a single connection line. For example, a connection comprising a first connection line, a second connection line, and two matching signal routing blocks (e.g. a From block and matching GoTo block), with the first connection line connected between the first block and the From block and the second connection line between the GoTo block and the second block, may apply. Other suitable configurations may also apply. As discussed herein, signal routing blocks are each assigned a unique tag parameter and matching signal routing blocks provided with the same tag parameter. The ports, signal routing blocks, and connections, e.g. connection lines, discussed herein are illustratively graphical representations of using global variables, pointers to memory, etc. from the programming language used for writing the code for the graphical computer environment.

In one embodiment, creation of each port block results in creation of a corresponding external port for the physical component subsystem. The port block is then automatically linked to the so-created (referred to as corresponding) external port. Correspondence, and accordingly linking between corresponding components, such as pairs of ports (e.g.

external ports of two blocks to be connected using a connection line), signal routing blocks (e.g. for establishing straightforward or backward connection between blocks), or the like, may be based on name, number, or the like. For example, when linking blocks having a correspondence established by number, upon the port blocks being created, the first created port block may create, and accordingly be linked to, the first created external port, the second created port block may create, and accordingly be linked to, the second created external port, and so on. Therefore, an ascending ordering of correspondence is used in which the first port block corresponds to the first external port, the second port block to the second external port, and so on. It should be understood that other means of establishing correspondence (e.g. reverse ordering) between blocks and ports may apply. The order of correspondence used may be stored in memory.

The next step 308 may then be to determine (e.g. by reading parameters (e.g. identifiers) stored in memory) whether the main ports created at step 302 are provided with one-way or two-way signal propagation capability. Indeed, the blocks (e.g. port blocks and signal routing blocks discussed further below), ports (e.g. main ports and additional domain ports) of the functional block(s), and connections (e.g. connection lines) used to represent the physical system in the graphical modeling environment may comprise uni-directional or bi-directional components and the model created in the graphical modeling environment may comprise one-way components or two-way components only but also a mixture of one-way and two-way components. As a result, unidirectional and/or bi-directional signal propagation may be provided during simulation of the physical system's model.

If it is determined at step 308 that the main domain ports are provided with one-way propagation capability, bidirectional signal propagation at the main domain ports (e.g. to implement backward connection between the physical component subsystem block and other blocks provided at the main layer) can be implemented by creating 310 for the current functional block extra internal input and output ports for main domain backward connection. The order of correspondence between the extra input and output ports and the external input and output ports of the physical component subsystem block may also be specified. For example, the order between the extra input ports and the external output ports can be ascending if the first extra input port created for backward connection receives a backward signal from a destination block connected with the first external output port of the physical component subsystem bloc. Each main domain backward connection port is further connected with a signal routing or tag block, referred to herein as a main domain signal routing block. In one embodiment, the main domain signal routing blocks may comprise signal receiving and sending blocks and may be implemented using From (or signal receiving) and Goto (or signal sending) blocks from Simulink®, with the From blocks being connected to the backward connection input ports, the Goto blocks being connected to the backward connection output ports, and each From block accepting a signal from a matching Goto block then passing it as output. It should be understood that, if a graphical modeling environment other than Simulink® is used, signal routing blocks other than From and Goto blocks and which provide for a connection between input and output ports without connection lines may apply. Also, suitable implementations other than the use of signal routing blocks, such as using pointers for propagating information from one port to another, may apply. It should further be understood that extra internal ports can also be created and connected to main domain signal routing blocks for allowing the physical component subsystem block to receive additional signals from common source blocks in the model. For example, such ports and signal routing blocks can be configured to receive information about rotation of a component (e.g. shaft speed) or any other suitable information.

If it is determined at step 308 that the main domain ports are not one-way components, i.e. they are two-way components, the step 310 may be skipped and two-way signal propagation capability may be implemented without creation of extra ports for backward connection, as will be discussed further below with reference to FIG. 5c. The next step 312 is then to connect one or more signal routing blocks (referred to herein as additional domain signal routing blocks) to the additional domain connection ports. As discussed above, the additional domain signal routing blocks may be implemented using From and Goto blocks from Simulink®, with the From blocks being connected to the additional domain input ports and the Goto blocks being connected to the additional domain output ports, and each From block accepting a signal from a matching Goto block then passing it as output. Alternatively, pointers or the like may be used.

The next step 314 may then be to determine whether the additional domain ports created at step 302 are provided with one-way or two-way signal propagation capability. If it is determined at step 314 that the additional domain ports are provided with one-way propagation capability, bidirectional signal propagation at the additional domain ports (e.g. to implement backward connection between the physical component subsystem block and other blocks provided at the sub-layer) can be implemented by creating 316 for the current functional block extra internal input and output ports for additional domain backward connection. The order of correspondence between the extra input and output ports and the external input and output ports of the physical component subsystem block may also be specified. For example, the order between the extra input ports and the external output ports can be ascending if the first extra input port created for backward connection receives a backward signal from a destination block connected with the first external output port of the physical component subsystem block. Each additional domain backward connection port is further connected with an additional domain signal routing block.

If it is determined at step 314 that the additional domain ports are not one-way components, i.e. they are two-way components, the step 316 may be skipped and two-way signal propagation capability may be implemented without creation of extra ports for backward connection, as will be discussed further below with reference to FIG. 5c. The next step 318 may then be to associate memory storage with each physical component built as a subsystem, thereby allowing to assign and save parameter(s) of the physical component subsystem block. These parameters may comprise any parameters relevant for the physical component, such as geometrical parameters (e.g. pipe diameter and/or length) of the physical component, a type of liquid flowing through the physical component, a component (e.g. shaft) from which to receive specific information (e.g. speed information), a number of inputs and outputs, and the like. The physical component subsystem block's parameters may also be indicative of a type (e.g. custom type) of the physical component subsystem block. Indeed, at step 320, a unique block type identifier list is illustratively created and associated in memory with the physical component subsystem block's parameters. The block type identifier may comprise a unique number, name, class, subclass, or any other attribute suitable for uniquely identifying each physical component subsystem block representative of a given physical component. The block type identifier may accordingly indicate that the physical component subsystem block is of the custom type, thereby distinguishing the physical component subsystem block from blocks from the graphical modelling environment's built-in model library, which can be referred to as being of a standard type. The block type identifier associated with the physical component subsystem may further indicate that the corresponding physical component belongs to (and therefore participates in a process of) more than one physical domain.

In one embodiment, the custom block type identifier may be a name or class of the physical component subsystem block, e.g. "pipe" or "valve". In another embodiment, the block type identifier may be a In one embodiment, graphical modeling environment blocks may have associated therewith a different block type identifier, e.g. a standard block type identifier. Examples of standard block type identifiers include, but are not limited to, "block", "subsystem", "scope", "display". The block type identifiers (e.g. custom or standard) may then be used to find blocks in the graphical model as well as to determine actions to be taken for a given block according to a type thereof, e.g. when establishing connections. For example, it may be determined form the block type identifier that a backward connection is to be established for the given block. This may for instance be the case if the block is of type "pipe", which would need to send information to upstream block(s). Also, upon determining the blocks connected to the given block and correlating this information to the block type, it may be determined whether the connections are allowed for the given block in accordance with its type. It may also be determined that that the corresponding physical component belongs to more than one physical domain and that an image is therefore to be created for the physical component subsystem. All created identifiers may be stored in memory as a list or in any other suitable manner. In addition, for each physical component subsystem block, the memory storage may comprise data indicating establishment of a backward connection at a given port of the physical component subsystem block.

At step 322, one or more unique connection identifiers may further be created for each additional domain of the physical component subsystem block and assigned to the physical component subsystem block's parameters. In particular, a connection identifier may be used to identify an instance of a connection (e.g. via the additional domain ports) between the current physical component subsystem blocks and a block provided at another hierarchical level (and accordingly another physical domain) of the model.

Figure 5B:
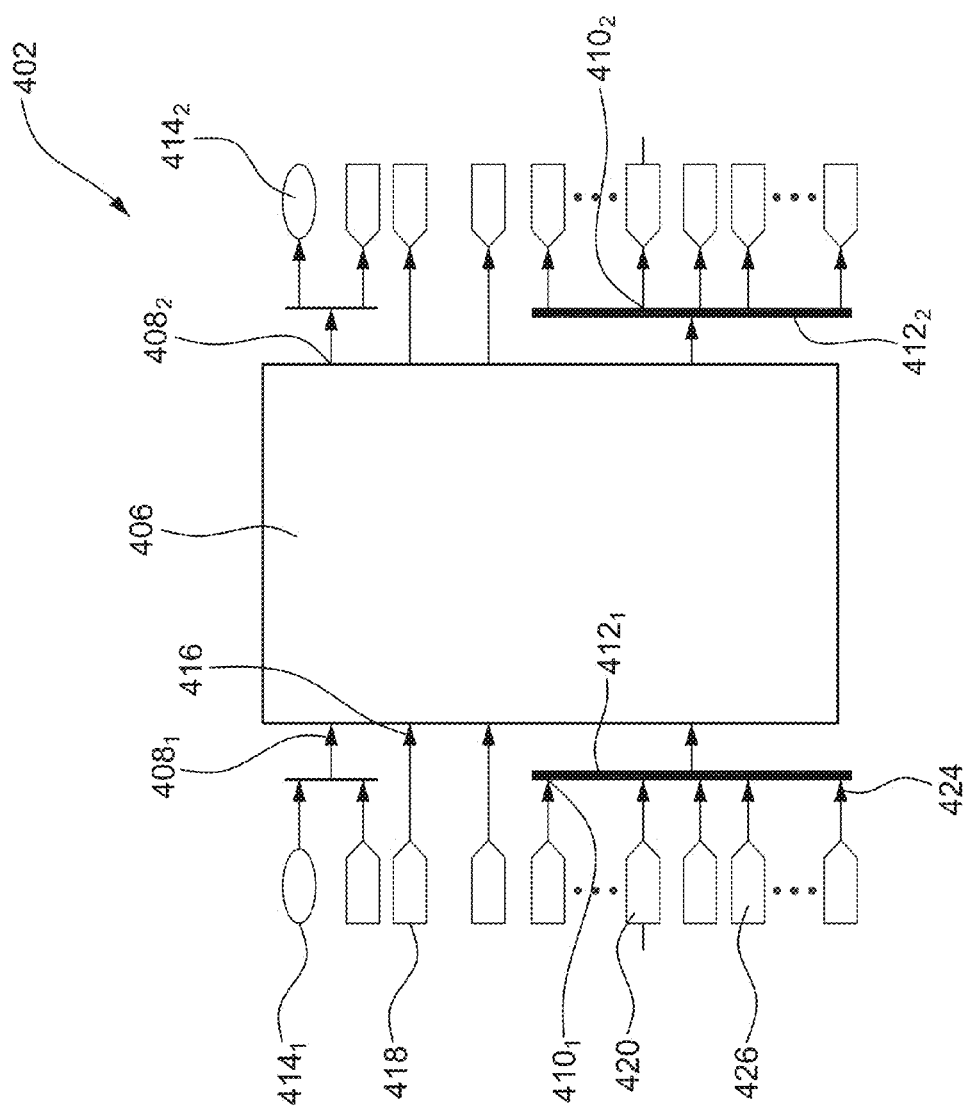

FIG. 5a illustrates an exemplary multi-domain graphical model 400 in accordance with an illustrative embodiment. In the illustrated embodiment, all ports, blocks, and connections (e.g. connection lines) are provided with one-directional signal propagation capability. The model 400 illustratively comprises a multi-domain flow element 402 (e.g. a pipe) provided in a first hierarchical level of the graphical model, the first level representative of the flow (or main) physical domain of the physical system being modelled. The flow element 402 is built at step 202 of FIG. 4a as a physical component subsystem block having an external input port $404_1$ and an external output port $404_2$ for enabling connection of the flow element 402 with other blocks (not shown) provided at the first hierarchical level. Referring now to FIG. 5b in addition to FIG. 5a, the physical component subsystem block representative of the flow element 402 is built so as to comprise a functional block 406 representing a flow or thermal chamber. As discussed above, the flow element 402 is built as a masked subsystem such that the functional block 406 as well as the ports and blocks associated therewith are located at a lower hierarchical level than the first hierarchical level.

As can be seen in FIG. 5b, the functional block 406 is provided with main domain input ports as in $408_1$ and main domain output ports $408_2$. Additional domain input ports as in $410_1$ and additional domain output ports as in $410_2$ are also provided. Blocks for signal grouping, e.g. Mux blocks as in $412_1$ and Demux blocks as in $412_2$, are further provided and connected to several of the input ports as in $408_1$ and $410_1$ and the output ports as in $408_2$ and $410_2$, respectively. Input and output port blocks as in $414_1$ and $414_2$ are further respectively connected to the main domain ports as in $408_1$, $408_2$ (e.g. via the blocks for signal grouping, if any) and may be respectively linked to the external ports $404_1$, $404_2$ of FIG. 5a. In the illustrated embodiment, the physical component subsystem also comprises extra ports (e.g. extra input and output ports) as in 416 for main domain backward connection that are configured to enable two-way connection to be provided at the first hierarchical level, as discussed above. Main domain signal routing blocks as in 418 are accordingly connected to the extra ports for backward connection as in 416 and configured to be linked to corresponding signal routing blocks for backward connection (not shown) created for other blocks (e.g. upstream or downstream) provided in the first hierarchical level to establish physical connection. In this manner, the flow element 402 is configured to bi-directionally exchange information with the other elements or blocks (not shown) provided in the first hierarchical level.

In particular, via the main domain ports as in $408_1$, $408_2$ and port blocks as in $414_1$, $414_2$, the flow element 402 can receive information from upstream blocks and output information to downstream blocks, the upstream and downstream blocks present in the flow domain. Via the extra ports for backward connection as in 416 and the main domain signal routing blocks as in 418, the flow element 402 can further receive information from downstream blocks and output information to upstream blocks. As discussed above, information is illustratively exchanged between matching signal routing blocks, e.g. matching From and Goto blocks. As also discussed above, one or more extra ports may be created and connected to main domain signal routing blocks as in 418 for receiving additional signals (e.g. shaft speed) from common source blocks in the model.

Still referring to FIG. 5b in addition to FIG. 5a, the flow element 402 further comprises additional domain signal routing blocks as in 420 connected to the additional domain ports as in $410_1$ and $410_2$ (e.g. via the blocks for signal grouping, if any). In this manner, and as will be discussed further below, at least one image block as in 422 built as a representation of the flow element 402 may be located in hierarchical levels of the model other than the first hierarchical level and communicate with other blocks present in these other layers of the graphical model to emulate signal propagation between the original physical component subsystem block (e.g. representative of the flow element 402) and the other blocks. The image block 422 illustratively communicates with the original block (i.e. the flow element 402) via the additional domain ports as in $410_1$ and $410_2$ and additional domain signal routing blocks as in 420 so that information is received at the flow element 402 from the image block 422 (e.g. as shown by line $423_1$ of FIG. 5a) and output by the flow element 402 to the image block 422 (e.g.

as shown by line 423$_2$ of FIG. 5a). The flow element 402 may further comprise extra ports as in 424 providing additional domain backward connection, as discussed above. Additional domain signal routing blocks for backward connection as in 426 are thus connected to the extra ports as in 424 for additional domain backward connection and configured to be linked to corresponding signal routing blocks for backward connection (e.g. signal receiving block 427) created for other blocks (e.g. upstream or downstream) provided in the second hierarchical level to establish physical connection. In this manner, via the signal routing blocks as in 426, the image block 422 is configured to output information (e.g. as shown by line 423$_3$ of FIG. 5a) to upstream blocks as in 428$_1$ provided at the thermal layer and to receive information (e.g. as shown by line 423$_4$ of FIG. 5a) from downstream blocks as in 428$_2$ provided at the thermal layer, thereby enabling bidirectional communication. As discussed above, information is illustratively exchanged between matching signal routing blocks 426, e.g. matching From and Goto blocks having the same tag parameters.

Figure 5C:
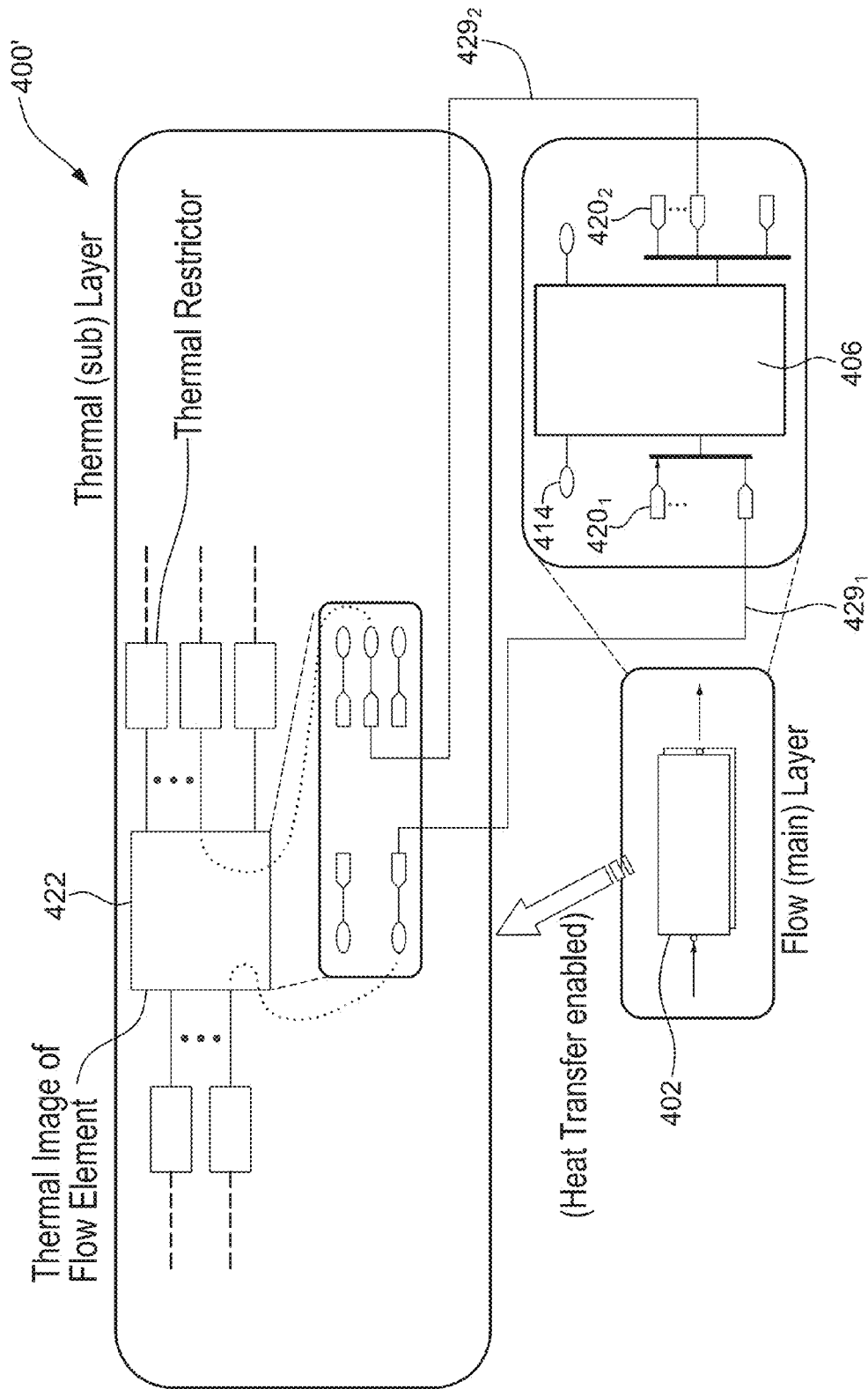
FIG. 5c is a schematic diagram illustrating the establishment of heat transfer between a flow layer and a thermal layer using components with two-way signal propagation capability, in accordance with one embodiment.

Referring now to FIG. 5c, there is illustrated an exemplary multi-domain graphical model 400' where all ports, blocks, and connections (e.g. connection lines) are provided with unidirectional signal propagation capability. As discussed above, in this case, no extra ports for backward connection need to be created. In the model 400', the functional block 406 is only provided with port blocks as in 414 connected to corresponding main domain ports (not shown) and signal routing blocks as in 420 connected to additional domain ports. No extra ports for backward connection, such as the ports as in 416 and 424 of FIG. 5b, are provided as the blocks 414, 420 and the corresponding ports are provided with two-directional signal propagation capability. In the illustrated embodiment, a first bi-directional connection 429$_1$ is established between a first additional domain signal routing block 420$_1$ and the image block 422 (e.g. a first signal routing block thereof, as will be discussed further below) while a second bi-directional connection 429$_2$ is also illustratively established between a second additional domain signal routing block 420$_2$ and the image block 422 (e.g. a second signal routing block thereof, as will be discussed further below) to enable the exchange (e.g. receiving/sending) of signals between the flow element 402 and the image block 422. The first connection 429$_1$ may be used to communicate first information from/to a first sub-layer block (not shown) the image block 422 is connected to via the first signal routing block while the second connection 429$_2$ may be used to communicate second information from/to a second sub-layer block (not shown), which is provided at the second hierarchical level of the model and to which the image block 422 is connected to via the second signal routing block. Although not illustrated, it should be understood that, depending on the application, any number of bi-directional connections other than two (2) may apply. It should also be understood that one or more bi-directional connections may be established at the port blocks 414 between the flow element 402 and blocks provided at the first hierarchical level.

Referring to FIG. 4b, the step 204 of building an image block in a given hierarchical level of the model will now be described. Step 204 illustratively comprises creating at step 502 a block comprising one or more connection ports that provide connection, e.g. via connection lines, with other blocks present in the given domain. The connection ports are illustratively created at step 502 in a number require to provide connection with the other blocks present in the given domain. Therefore, the number of the image block's connection ports may be different from the number of the original block's ports, i.e. the number of main and additional domain ports created at step 304 of FIG. 4a. It should also be understood that the connection ports may comprise input and/or output connection ports. The next step 504 may then be to create, at each connection port, one or more input or output signal routing blocks (e.g. From or Goto blocks) and input or output port blocks (depending on whether the connection port is an input or an output port). This is seen in FIG. 5a, where a given image block as in 422 comprises external connection ports as in 430 that allow the image block 422 to connect, e.g. through unidirectional connection lines as in 432 (or any other suitable connection, as discussed above), to blocks, e.g. the upstream and downstream blocks 428$_1$, 428$_2$, present in the given hierarchical level (e.g. the thermal layer). The image block 422 is illustratively built as a masked subsystem comprising port blocks as in 434, each connected to a corresponding signal routing block 436 and linked (e.g. by name, number, etc.) to a corresponding connection port 430. It should be understood that unmasked subsystems may also apply.

In one embodiment, the image block 422 receives information from the blocks, e.g. the upstream and downstream blocks 428$_1$, 428$_2$, via its external connection ports as in 430. This information is then sent to the port block 434 linked to the external port 430 and in turn to the signal routing block 436. The total number of input port blocks and signal routing blocks is then illustratively equal to the number of input connection ports of the image block while the total number of output port blocks and signal routing blocks is equal to the number of output connection ports of the image block. As can be seen in FIG. 5a, the image block 422 indeed comprises two (2) input connection ports and three (3) output connection ports as in 430. Therefore, two (2) input port blocks as in 434 and two (2) input signal routing blocks as in 436 as well as three (3) output port blocks and three (3) output signal routing blocks are created for the image block 422.

The input and/or output signal routing blocks created at step 504 (e.g. signal routing blocks as in 436) are illustratively configured to exchange signals with matching (e.g. having the same tag parameter) additional domain signal routing blocks as in 420 provided at the higher hierarchical level (e.g. the flow layer) for the physical component subsystem block (e.g. the flow element 402) the image block 422 is representative of. In the illustrated embodiment, this allows for heat transfer to occur between the flow element 402 present in the flow domain and elements present in other domains (e.g. upstream and downstream blocks 428$_1$, 428$_2$ present in the thermal domain) by signals being exchanged between the blocks via the image block 422, which serves as an intermediate block emulating the operation and properties of the physical component subsystem block 402. In one embodiment, the main domain block (e.g. the flow element 402), via the image block(s) as in 422, receives information from the elements present in other domains and connected to the image blocks(s) 422 (e.g. the upstream and downstream blocks 428$_1$, 428$_2$ present in the thermal domain), receives information from elements present in the main domain (not shown), and processes the received information to generate information that is in turn output to the elements present in the other domains and which are connected to the image block(s) 422. The generated information may be output to the other elements through unidirectional or bi-directional connections. In one embodiment, physical connection can be established using extra backward connection ports created for the original block, as discussed herein above with reference to FIG. 4a.

Referring back to FIG. 4b, after creating signal routing blocks and port blocks at step 504, the next step 506 may be to assess whether the signal routing blocks and port blocks of the image block are one-directional. If it is determined at step 506 that the signal routing blocks and port blocks are one-directional, e.g. the signal routing blocks comprise input and output signal routing blocks and the port blocks comprise input port (or inport) and output port (or outport) blocks that allow signal propagation in one direction only, the next step 508 is to connect a first part of the signal routing blocks to the inport blocks and a second part of the signal routing blocks to the outport blocks. In particular, the image block's signal routing blocks (e.g. the input signal routing blocks or Goto blocks), which are configured to receive information, are connected to the inport blocks and connect the signal routing blocks (e.g. the output signal routing blocks or From blocks), which are configured to output information, to the outport blocks. Otherwise, if it is determined at step 506 that the signal routing blocks and port blocks are not one-directional, i.e. are bi-directional, the signal routing blocks are connected to the port blocks at step 510 without distinction with regards to signal propagation directionality.

After steps 508 or 510 have been performed, the next step 512 may be to associate memory storage with the image block, thereby allowing to assign and save parameter(s) of the image block. These parameters may comprise a type of the block (e.g. a block type identifier), a number of inputs and outputs (e.g. input and/or output connection ports) for the block, and an identification of the original block the image block is an image of. At step 514, a unique identifier list is indeed illustratively created and associated in memory with the image block's parameters. The identifier may comprise a unique number, name, class, subclass, or any other attribute suitable for uniquely identifying each image block representative of a given physical component and indicating that the image block is a custom-type block that is a representation of a given physical component subsystem block. As for the physical component subsystem block, the identifier may comprise a unique number, name, class, subclass, or any other attribute suitable for uniquely identifying each image block. The identifier may accordingly indicate that the image block is of the custom type, thereby distinguishing the image block from blocks from the graphical modelling environment's built-in model library, which can be referred to as being of a standard type. In one embodiment, the identifier may be a name or class of the image block, e.g. "image". In another embodiment, the identifier may be a unique number generated by the graphical environment, e.g. a handle in Simulink®. All created identifiers may be stored in memory as a list or in any other suitable manner. The block type identifiers may then be used to find blocks in the graphical model as well as to determine actions to be taken for a given block according to a type thereof, e.g. when establishing connections. For example, upon identifying the given block as being of the image type, it may be determined that, in order to establish backward connection where the image block serves as an intermediate block, the identification of the original block is to be obtained from the image block parameters.

At step 516, one or more unique connection identifiers may further be created and assigned to the image block's parameters. In particular, a connection identifier may be used to identify an instance of a connection (e.g. via the connection ports) between the image block and a block provided at another hierarchical level (and accordingly another physical domain) of the model.

Figure 6:
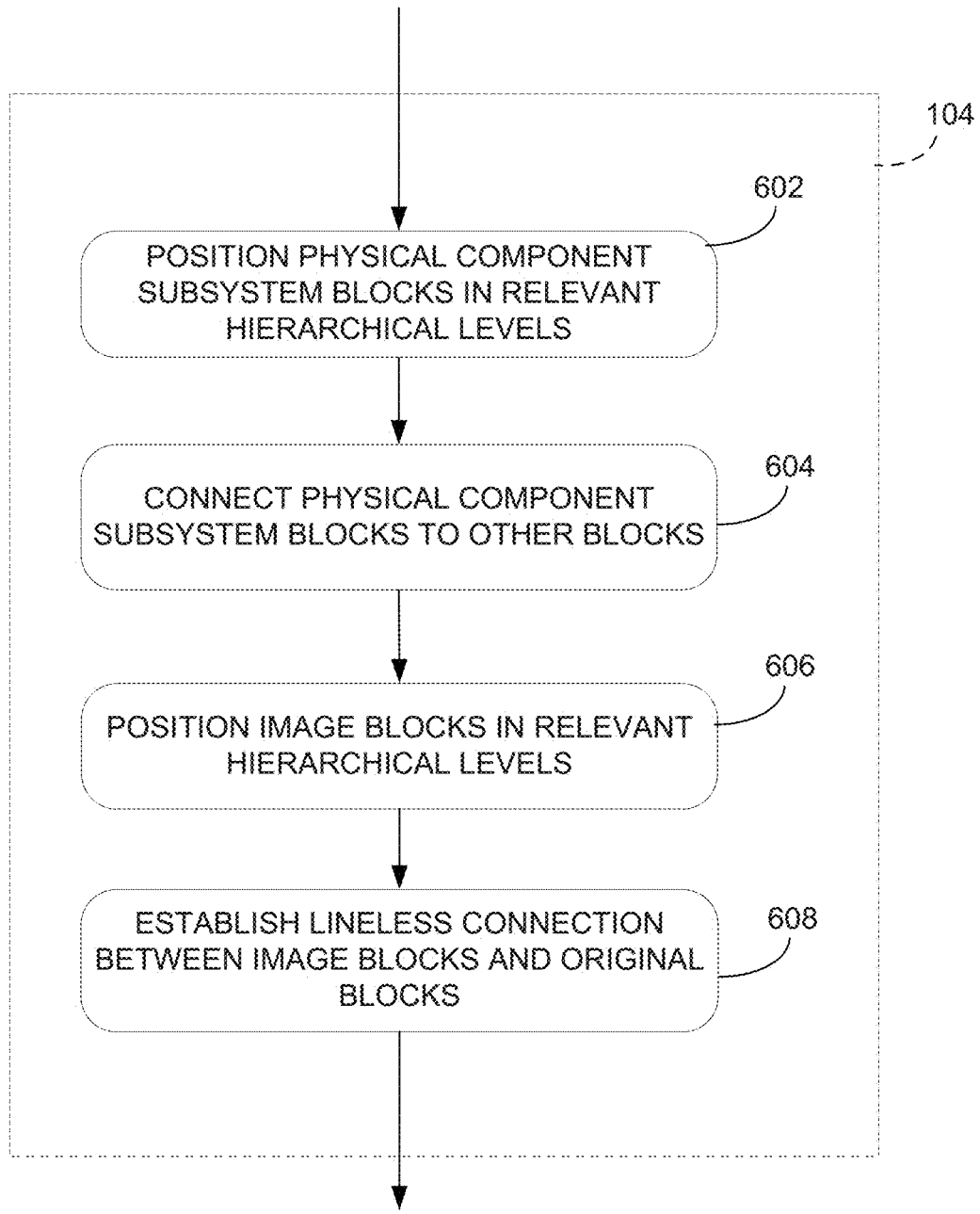
FIG. 6 is a flowchart of the step of FIG. 2 of building a multi-domain graphical network model.

Referring now to FIG. 6, the step 104 of building a multi-domain graphical network model illustratively comprises building the model, which is representative of the physical system, as a network of connected blocks, with the blocks participating in each physical domain being grouped in separate hierarchical levels of the model. It should be understood that the separation may be full or partial to keep, for example, the acceptable level of model readability. It should also be understood that a given physical domain (or hierarchical level of the model) may be a subsystem comprised of additional physical domains. For this purpose, physical component subsystem blocks built at step 202 of FIG. 3 are illustratively positioned at step 602 in their relevant hierarchical levels (i.e. physical domains) of the model in accordance with the process of the domain the corresponding physical components participate in.

The next step 604 may be to connect each physical component subsystem block to additional blocks (e.g. blocks from the model library or other physical component subsystem blocks) provided in the corresponding hierarchical level. The connection may be unidirectional or bidirectional. A physical connection (e.g. a connection having functionalities of two-way signal propagation, i.e. including backward signal propagation, as well as parameters exchange between connected blocks, signals management, and connection errors trapping) may be provided between the physical component subsystem block and other blocks provided in the first hierarchical level (e.g. main layer). The physical connection may also be provided between the physical component subsystem block and other blocks provided in the second hierarchical levels (e.g. sub-layers). In this manner, a backward connection may be provided between the physical component subsystem block and other blocks of the model. In one embodiment where the model elements are unidirectional, the physical connection is established using the system and method described in commonly assigned and co-pending U.S. application Ser. No. 14/486,527 entitled PHYSICAL CONNECTION OF NETWORK COMPONENTS IN A GRAPHICAL COMPUTER ENVIRONMENT WITH ONE-WAY SIGNAL PROPAGATION, and which the entire disclosure thereof is hereby incorporated by reference. Such physical connections are illustrated by lines $423_2$ and $423_4$ of FIG. 5a.

In one embodiment, the physical connection may be established between the physical component subsystem block and other blocks provided in the second hierarchical levels (e.g. sub-layers) with the image block participating in the process of building the backward connection. In particular, when establishing a physical connection for a given upstream or downstream block located at the given hierarchical level (e.g. sub-layer) the image block is located in, a search for blocks connected to the given upstream or downstream block may first be performed. If the directly connected is not an image block, the same process of establishment of the physical connection as described in U.S. application Ser. No. 14/486,527 applies. It should be understood that, as an alternative to searching for blocks connected to a given upstream or downstream block for which physical connection is to be established, a search for all blocks connected to a given image block or for all blocks connected to each of the blocks provided in the second hierarchical levels (e.g. sub-layers) may be performed If it is determined that the connected block is an image block, e.g. image block 422 in FIG. 5a, the image block parameters may be retrieved from memory and searched to determine the original physical component, e.g. flow element 402 in FIG. 5a, the image block is representative of. The image block parameters may also be searched to determine to which port, e.g. external port 430, of the image block the upstream or downstream block, e.g. upstream block 428$_1$ in FIG. 5a, is connected. The image block's port block and signal routing block, which are linked to the identified port, may accordingly be determined as well as the original block's signal routing block, which is linked (e.g. corresponds) to the image block's signal routing block. As a result, it is possible to identify, on the basis of the order of correspondence between ports (e.g. ascending or descending order, as discussed above), the extra internal port for backward connection (in this case additional domain backward connection) created for the original block and corresponding to the identified signal routing block. The corresponding extra internal port for backward connection created for the upstream or downstream block connected to the image block may also be determined and physical connection established therebetween. Data indicative of establishment of the physical connection may be stored in memory and associated with the block parameters.

For instance, referring to FIG. 5a, it may be determined that the upstream block 428$_1$ in FIG. 5a is connected to the last external input port 430 of the image block 422, that the last inport block 434 and the last signal sending block 436 of the image block 422 are used to transmit information from the upstream block 428$_1$ to the last additional domain signal receiving block 420 of the flow element 402. Accordingly, it may be determined that the last extra backward connection port (not shown) and the last signal sending block for backward connection 426 of the flow element 402 as well as the last extra backward connection port (not shown) and the last signal receiving block for backward connection 427 of the upstream block 428$_1$ are to be linked to establish the physical connection (including backward signal propagation) 423$_3$ between the flow element 402 and the upstream block 428$_1$. The physical connection may be established as described in U.S. application Ser. No. 14/486,527. It should be understood that a physical connection 423$_4$ may similarly be established between the flow element 402 and the downstream block 428$_2$.

The image blocks representative of the physical component subsystem blocks and created at step 204 of FIG. 3 are then automatically positioned at step 606 in their relevant hierarchical levels and connected to model-library blocks present in the relevant hierarchical levels. For this purpose, unidirectional connection lines or other suitable connections may be used to connect the image block's connection ports to input and output ports of upstream and downstream blocks provided in the given hierarchical levels. Processing logic is then applied at step 608 in order to establish a connection, e.g. a lineless connection, between the image blocks and the original multi-domain blocks the image blocks are representative of.

Figure 7:
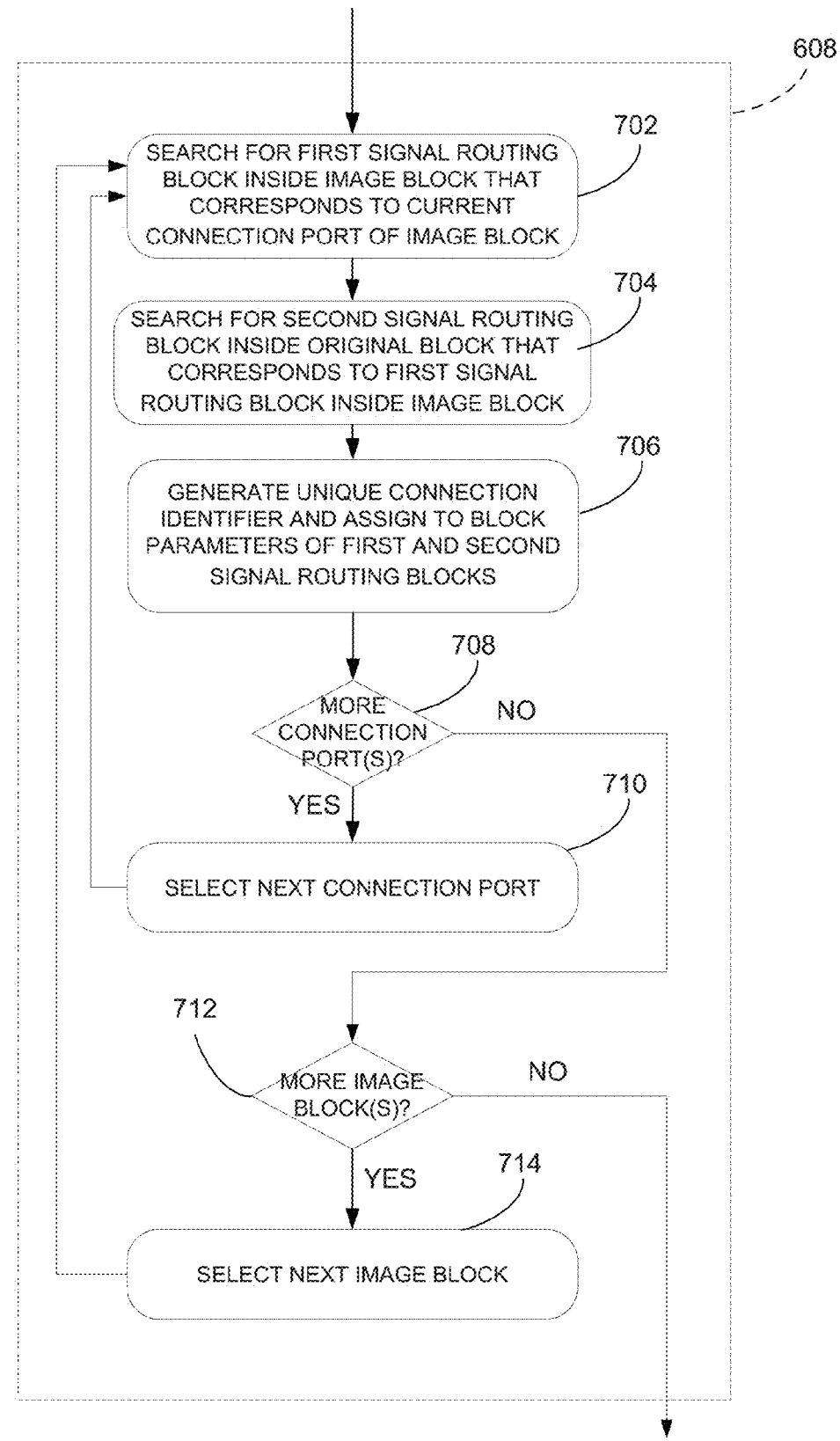
FIG. 7 is a flowchart of the step of FIG. 6 of applying pre-processing logic to establish connection between image blocks and original blocks.

Referring now to FIG. 7, the step 608 of establishing a connection, e.g. without connection lines or lineless, between the image blocks and the original multi-domain blocks illustratively comprises, for each image block and a given connection port (referred to herein as current connection port) thereof, searching at step 702 for a first signal routing block, inside the image block that corresponds (i.e. is linked to) to the current connection port. The next step 704 may then be to search for a second signal routing block inside the original block, the second signal routing block being an additional domain signal routing block that is provided at the higher hierarchical level and is matched (e.g. has the same tag parameter) to the first signal routing block. At step 706, The connection identifiers created for the physical component subsystem block and the image block in the manner discussed above with reference to FIG. 4a and FIG. 5b may then be linked in memory (e.g. be assigned the same value) to indicate establishment of the lineless connection between the first and the second signal routing blocks. In this manner, the image block is linked to the original physical component subsystem block, e.g. via a hidden or lineless link, such that the image block can emulate the original's block behaviour (e.g. receipt and output of signals) while being located in a different hierarchical level than that of the original block. The image block can then pass (e.g. via its signal routing block(s) connected to its input port block(s)) the information it receives (e.g. through the input connection port(s) and port block(s)) to the original physical component subsystem block, the latter in turn processing the information by applying the mathematical model and outputting information (e.g. through its additional domain ports). The information output by the physical component subsystem block may be used at the hierarchical layer the physical component subsystem block is located in and/or may be sent back to the image block for use at the sub-layer the image block is located in. In the latter case, the image block may receive the output information from the physical component subsystem block (e.g. via its signal receiving block(s)) and pass this information (e.g. via its output connection port(s) and port block(s)) to one or more downstream blocks connected to its output connection port(s). When the physical connection functionality is implemented, the physical component may output information to other blocks present at the sub-layer directly (e.g. without the information passing through the image block).

The next step 708 may then be to determine whether additional connection ports exist for the current image block. If this is the case, the next connection port is selected at step 710 and steps 702 to 708 are repeated for the next connection port. If it is determined at step 708 that there are no more connection ports for the current image block, the next step 712 may then be to determine whether additional image blocks are provided in the graphical model, e.g. in the same hierarchical level as the one the current image block is present in or in other hierarchical levels. It should indeed be understood that several image blocks, each representative of a given physical component subsystem block, may be provided at a given hierarchical level. In addition, several image blocks may be created for each physical component subsystem block and positioned in different hierarchical levels of the model. If it is determined at step 712 that more image blocks are present in the model, the next image block is selected at step 714 and the method repeats the above-described steps for the next image block. Otherwise, the method ends.

Figure 8:
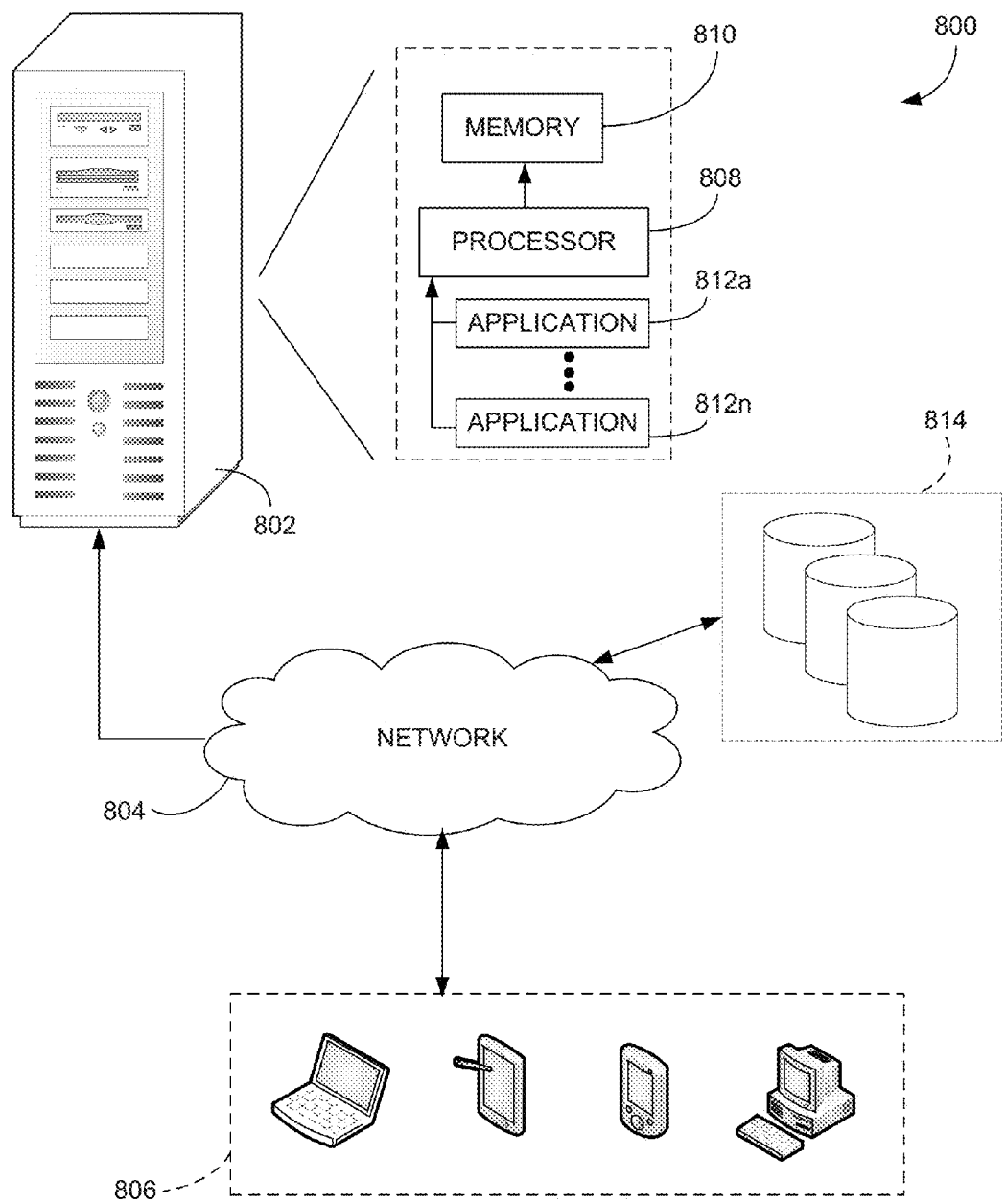
FIG. 8 is a schematic diagram of a system for multi-domain graphical modeling, in accordance with one embodiment.

Referring now to FIG. 8, a system 800 for multi-domain graphical modeling will now be described. The system 800 comprises one or more server(s) 802 accessible via the network 804. For example, a series of servers corresponding to a web server, an application server, and a database server may be used. These servers are all represented by server 802. The server 802 may be accessed by a user using one of a plurality of devices 806 adapted to communicate over the network 804. The devices 806 may comprise any device, such as a personal computer, a tablet computer, a personal digital assistant, a smart phone, or the like, which is configured to communicate over the network 804, such as the Internet, the Public Switch Telephone Network (PSTN), a cellular network, or others known to those skilled in the art. Although illustrated as being separate and remote from the devices 806, it should be understood that the server 802 may also be integrated with the devices 806, either as a downloaded software application, a firmware application, or a combination thereof. It should also be understood that several devices as in 806 may access the server 802 at once.

The server 802 may comprise, amongst other things, a processor 808 coupled to a memory 810 and having a plurality of applications 812a . . . 812n running thereon. It should be understood that while the applications 812a . . . 812n presented herein are illustrated and described as separate entities, they may be combined or separated in a variety of ways.

One or more databases 814 may be integrated directly into the memory 810 or may be provided separately therefrom and remotely from the server 802 (as illustrated). In the case of a remote access to the databases 814, access may occur via any type of network 804, as indicated above. The various databases 814 described herein may be provided as collections of data or information organized for rapid search and retrieval by a computer. The databases 814 may be structured to facilitate storage, retrieval, modification, and deletion of data in conjunction with various data-processing operations. The databases 814 may consist of a file or sets of files that can be broken down into records, each of which consists of one or more fields. Database information may be retrieved through queries using keywords and sorting commands, in order to rapidly search, rearrange, group, and select the field. The databases 814 may be any organization of data on a data storage medium, such as one or more servers.

In one embodiment, the databases 814 are secure web servers and Hypertext Transport Protocol Secure (HTTPS) capable of supporting Transport Layer Security (TLS), which is a protocol used for access to the data. Communications to and from the secure web servers may be secured using Secure Sockets Layer (SSL). Identity verification of a user may be performed using usernames and passwords for all users. Various levels of access rights may be provided to multiple levels of users.

Alternatively, any known communication protocols that enable devices within a computer network to exchange information may be used. Examples of protocols are as follows: IP (Internet Protocol), UDP (User Datagram Protocol), TCP (Transmission Control Protocol), DHCP (Dynamic Host Configuration Protocol), HTTP (Hypertext Transfer Protocol), FTP (File Transfer Protocol), Telnet (Telnet Remote Protocol), SSH (Secure Shell Remote Protocol).

The memory 810 accessible by the processor 808 may receive and store data. The memory 810 may be a main memory, such as a high speed Random Access Memory (RAM), or an auxiliary storage unit, such as a hard disk, flash memory, or a magnetic tape drive. The memory 810 may be any other type of memory, such as a Read-Only Memory (ROM), Erasable Programmable Read-Only Memory (EPROM), or optical storage media such as a videodisc and a compact disc.

The processor 808 may access the memory 810 to retrieve data. The processor 808 may be any device that can perform operations on data. Examples are a central processing unit (CPU), a front-end processor, a microprocessor, and a network processor. The applications 812a . . . 812n are coupled to the processor 808 and configured to perform various tasks as explained below in more detail. An output may be transmitted to the devices 806.

Figure 9:
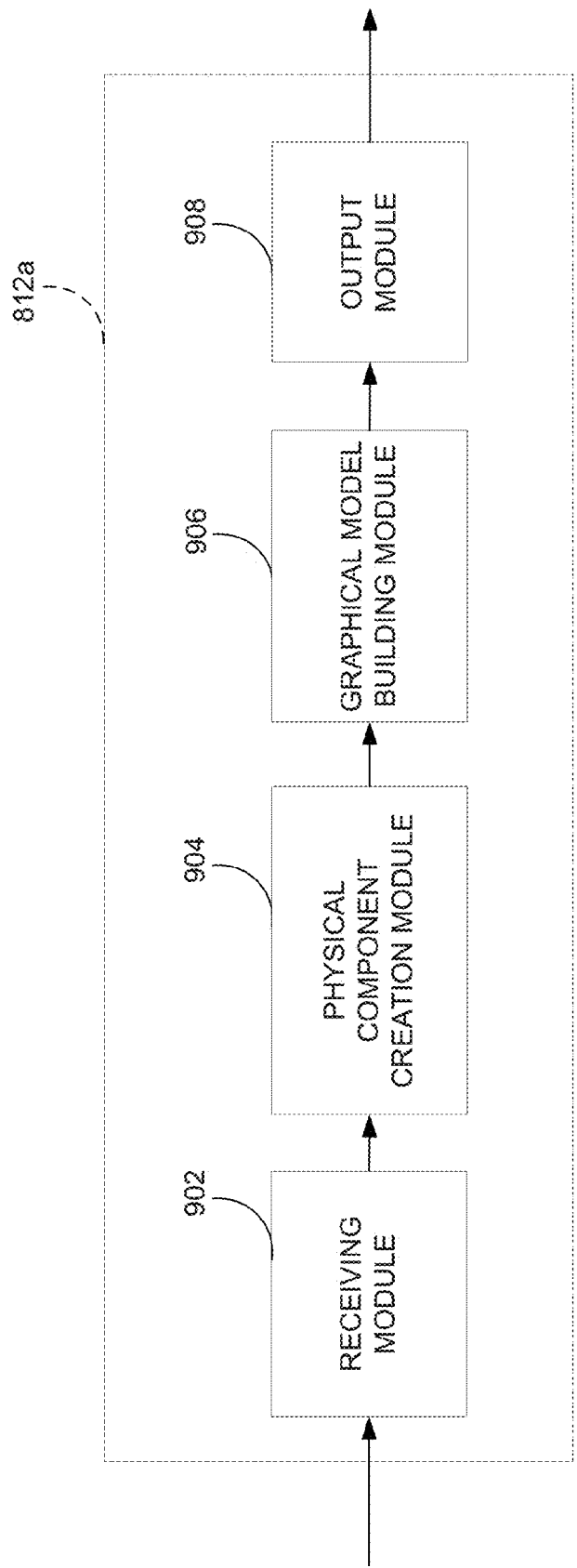
FIG. 9 is a block diagram showing an exemplary application running on the processor of FIG. 8.

FIG. 9 is an exemplary embodiment of an application 812a running on the processor 808. The application 812a may comprise a receiving module 902 for receiving input data from a user interacting with the graphical modeling environment (e.g. through one or more suitable input devices such as a screen, mouse, or the like, provided with the devices 806), a physical component creation module 904, a graphical model building module 906, and an output module 908 for outputting data to the user (e.g. through suitable output devices provided with the devices 806). The physical component creation module 904 is illustratively used to enable the methods illustrated and described in reference to FIG. 3, FIG. 4a, and FIG. 4b, thereby creating the custom physical component subsystem block(s) and image block(s). The graphical model building module 906 is illustratively used to enable the methods illustrated and described in reference to FIG. 6 and FIG. 7, thereby creating the graphical representation of the physical system by interconnecting the physical component subsystem blocks and image blocks with the model library blocks.

Figure 10:
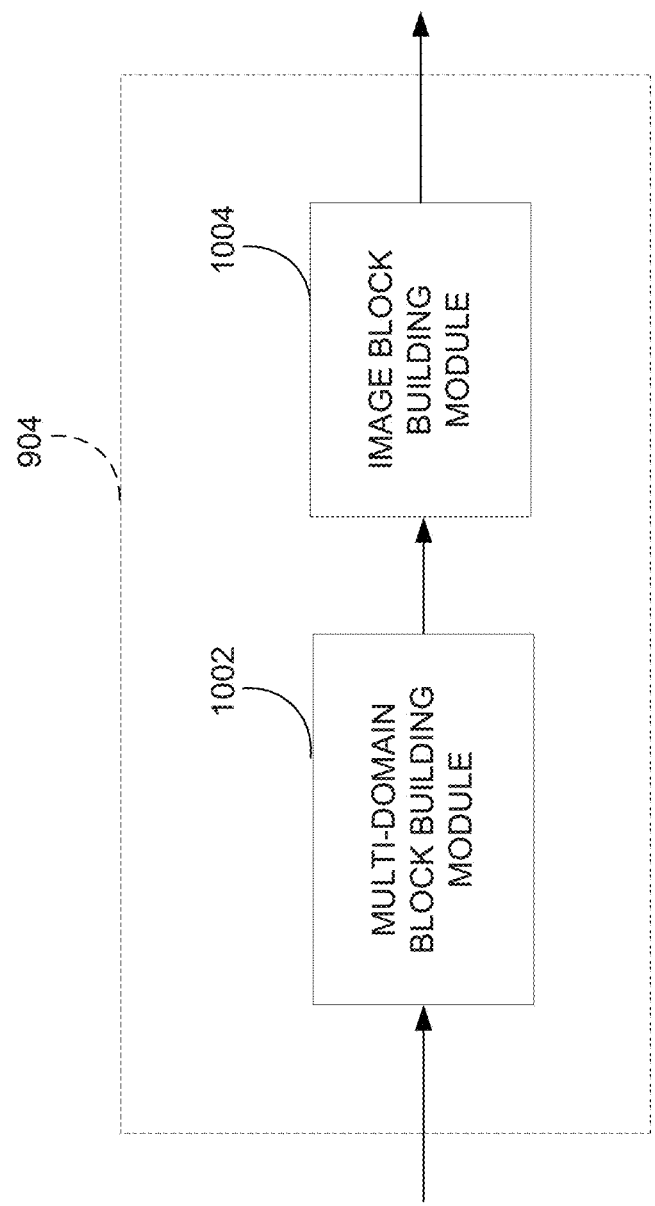
FIG. 10 is a block diagram of a physical component creation module of FIG. 9.

Referring to FIG. 10, the physical component creation module 904 illustratively comprises a multi-domain building module 1002, which enables the method illustrated and described in reference to FIG. 4a, FIG. 5a, FIG. 5b, and FIG. 5c, thereby building physical component subsystem blocks, and an image block building module 1004, which enables the method illustrated and described in reference to FIG. 4b, thereby building image blocks.

Figure 11:
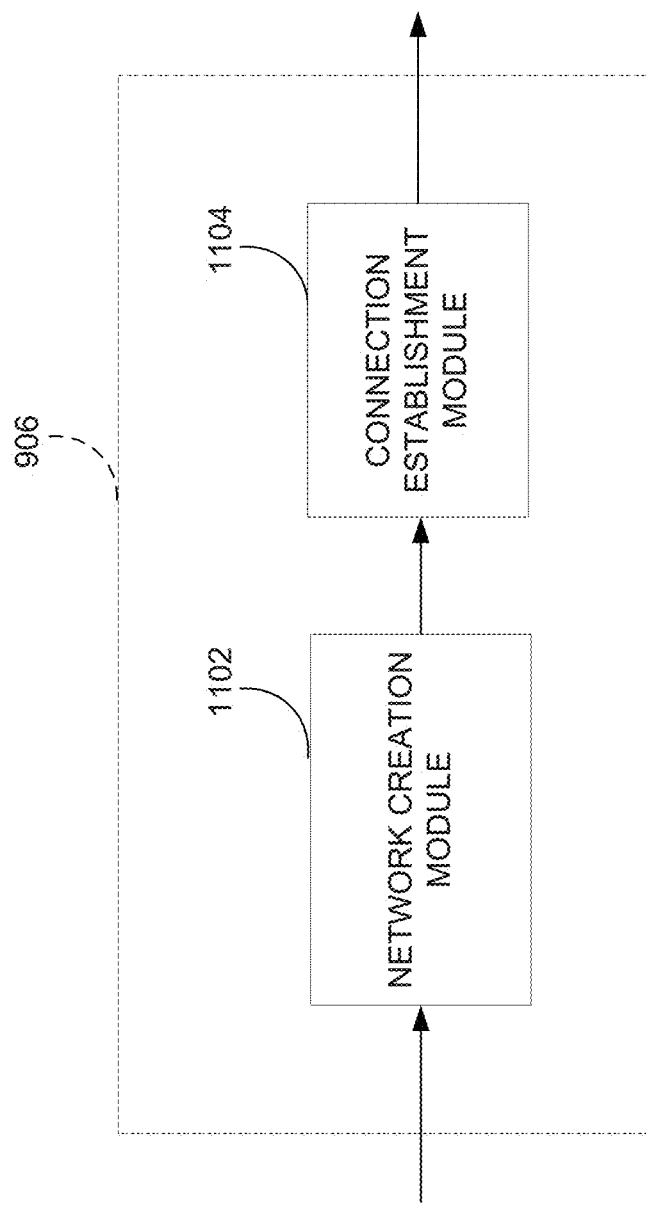
FIG. 11 is a block diagram of a graphical model building module of FIG. 9.

Referring to FIG. 11, the graphical model building module 906 illustratively comprises a network creation module 1102 for building a model as a network of connected blocks, as illustrated and described in reference to FIG. 6, and a connection establishment module 1104, which enables the method illustrated and described in reference to FIG. 7.

Figure 12:
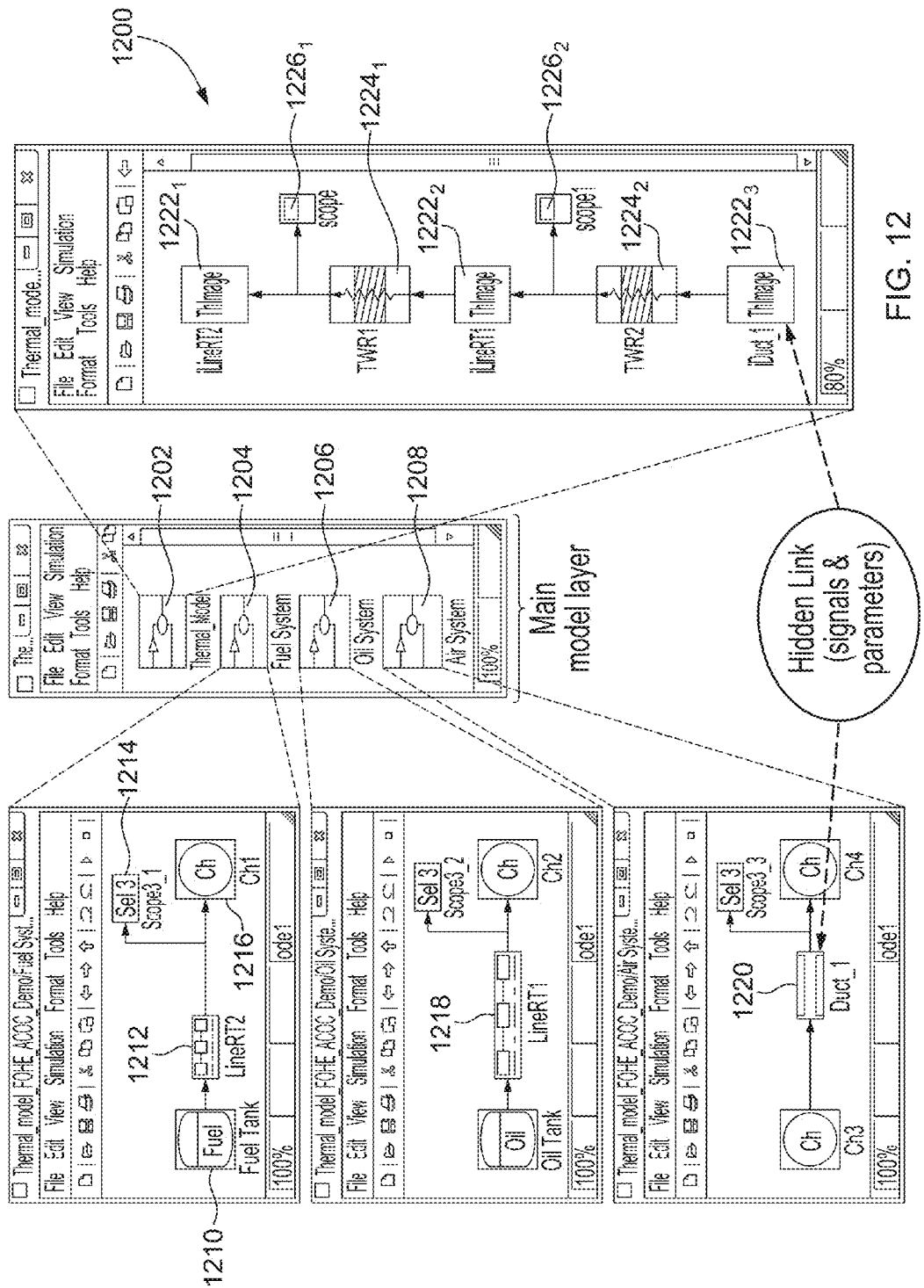
FIG. 12 is a screen capture illustrating a representation of a multi-domain physical system in a graphical modeling environment, in accordance with one embodiment.

Referring now to FIG. 12, there is shown a screen capture 1200 illustrating a multi-domain graphical model, as implemented using the method 100 and/or the system 800 described above. The screen capture 1200 comprises at a first hierarchical level thereof a main model layer and several sub-layers (e.g. a thermal layer, a fuel layer, an oil layer, an air layer) located at other hierarchical levels of the model. As discussed above, each model layer provided at a given hierarchical level of the model is representative of a corresponding physical domain of the physical system being modeled. As can be seen in FIG. 12, the main model layer comprises a thermal model 1202, a fuel system 1204, an oil system 1206, and an air system 1208. It should be understood that other systems may apply. The fuel system 1204 is illustratively modeled as comprising a plurality of physical component subsystem blocks, which may be interconnected together as well as with one or more model library blocks obtained from the graphical modeling environment's built-in library. In particular, the fuel system 1204 comprises a block 1210 representative of a fuel tank, a block 1212 representative of a restrictor, a selector block 1214 used to provide the restrictor's output to a scope block (not shown), and a block 1216 representative of a chamber. Blocks 1210, 1212, and 1216 are illustratively each built as masked physical component subsystem blocks, as discussed above, while the selector block 1214 is a model library block. The oil system and the air system also comprise physical component subsystem blocks, which may be interconnected together as well as with model library blocks. In particular, the oil system 1206 comprises a blocks 1218 representative of a restrictor and the air system 1208 comprises a block 1220 representative of a duct.

The thermal model 1202 illustratively comprises image blocks 1222$_1$, 1222$_2$, and 1222$_3$, which are respectively representations of the restrictor block 1212, restrictor block 1218, and duct block 1220 in the thermal layer. The image blocks are in turn interconnected with purely thermal components, such as the thermal restrictor blocks as in 1224$_1$ and 1224$_2$ as well as with scope blocks as in 1226$_1$ and 1226$_2$ for displaying signals generated during simulation. As discussed above, a hidden link is provided between each image as in 1222$_3$ and the original block as in 1220 the image block is representative of, with the hidden link enabling the image block to emulate operation (e.g. signal propagation, parameter transfer) of the original block. In particular, heat transfer can be enabled between the air layer and the thermal layer using the image block 1222$_3$.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure, and such modifications are intended to fall within the appended claims.

The invention claimed is:

1. A computer-implemented method for modeling a physical system in a graphical environment, the physical system encompassing a plurality of physical domains and comprising at least one multi-domain physical component participating in a process of a first one and at least a second one of the plurality of physical domains, the method comprising:
    using a graphical user interface to build a model of the physical system in the graphical environment, wherein building the model of the physical system comprises:
        providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and
        linking the at least one second block to the first block through one or more signals passing between the first block and the at least one second block to mimic one or more physical connections in the physical system, the first information transmitted from the at least one second block to the first block and second information transmitted from the first block to the one or more third blocks; and
    using an execution engine to execute the model of the physical system and trace system outputs as a function of time.

2. The method of claim 1, wherein providing the first block comprises:
    providing a first subsystem block comprising at least one functional block representative of a mathematical model of the at least one multi-domain physical component, the at least one functional block comprising at least one internal main domain connection port and at least one internal additional domain connection port; and
    providing at least one first port block, at least one first external connection port each associated with a corresponding one of the at least one first port block, and at least one first signal routing block, each of the at least one first external connection port connected via a first connection to a corresponding one of at least one second external connection port provided for one or more fourth blocks provided at the first hierarchical level and each of the at least one first port block connected to a corresponding one of the at least one main domain connection port and each of the at least one first signal routing block connected to a corresponding one of the at least one additional domain connection port,
    the first block receiving at the at least one first signal routing block the first information from the at least one second block, receiving at the at least one first port block third information communicated by at least one of the one or more fourth blocks through the first connection, and applying the mathematical model for processing the first and the third information and generating the second information.

3. The method of claim 2, wherein providing the at least one second subsystem block comprises:
    providing a second subsystem block comprising at least one third external connection port, at least one second port block, and at least one second signal routing block, each of the at least one second port block associated with a corresponding one of the at least one third external connection port, each of the at least one second signal routing block connected to a corresponding one of the at least one second port block and having associated therewith a corresponding one of the at least one first signal routing block, and each of the at least one third external connection port connected via a second connection to a corresponding one of at least one fourth external connection port provided for the one or more third blocks, the at least one second block receiving at the at least one second port block the first information communicated by the at least one third block through the second connection.

4. The method of claim 3, wherein linking the at least one second block to the first block comprises:
    for each one of the at least one third external connection port, identifying a given one of the at least one second port block associated therewith;
    identifying a given one of the at least one second signal routing block connected to the given second port block;
    identifying a given one of the at least one first signal routing block corresponding to the given second signal routing block; and
    associating, in a memory having stored therein first parameters for the given first signal routing block and second parameters for the given second signal routing block, a unique connection identifier with the first and second parameters for establishing a lineless connection between the given first and second signal routing blocks and causing the given second signal routing block to route the first information to the given first signal routing block.

5. The method of claim 4, wherein:
    providing the first block comprises providing the at least one additional domain connection port comprising at least one additional domain input connection port and at least one additional domain output connection port, providing the at least one first signal routing block comprising at least one first signal receiving block connected to the at least one additional domain input connection port and at least one first signal sending block connected to the at least one additional domain output connection port;

providing the at least one second block comprises providing the at least one third external connection port comprising at least one of at least one input connection port and at least one output connection port, the at least one third block connected to the at least one second block through the at least one input connection port and another one of the one or more third blocks connected to the at least one second block through the at least one output connection port, providing the at least one second port block comprising at least one of at least one second input port block associated with the at least one input connection port and at least one second output port block associated with the at least one output connection port, and providing the at least one second signal routing block comprising at least one of at least one second signal sending block connected to the at least one second input port block and at least one second signal receiving block connected to the at least one second output port block; and linking the at least one second block to the first block comprises linking the at least one second signal sending block to the at least one first signal receiving block and the at least one second signal receiving block to the at least one first signal sending block, the first information received at the at least one second block through the at least one second signal receiving block, output to the first block through the at least one second signal sending block, and received at the first block through the at least one first signal receiving block, the second information output to the at least one second block through the at least one first signal sending block, received at the at least one second block through the at least one second signal receiving block, and transmitted to the other third block through the at least one second output port block.

6. The method of claim 4, wherein providing the first block comprises associating a first memory with the first block, creating a first unique block identifier for the first block, and storing the first block identifier in the first memory, and providing the at least one second block comprises associating a second memory with the at least one second block, creating a second unique block identifier for each of the at least one second block, and storing the second block identifier in the second memory, the first and second block identifiers comprising one of a name, a class, and a unique number assigned to a respective one of the first and the at least one second block.

7. The method of claim 6, further comprising one of storing the first block identifier in the second memory and storing the second block identifier in the first memory.

8. The method of claim 7, wherein the first and the second memory have stored therein at least one parameter associated with a respective one of the first and the at least one second block and indicative of a signal propagation capability of the respective first and at least one second block and further wherein transmitting the second information comprises:

querying the first and the second memory to evaluate the at least one parameter and determine therefrom that at least one of the first and the at least one second block is provided with unidirectional signal propagation capability;

creating at least one internal backward connection port for the first block and connecting each of the at least one backward connection port to a signal routing block for backward connection;

establishing a physical connection between the first block and the at least one third block by linking the signal routing block for backward connection of the first block to a corresponding signal routing block for backward connection provided for the at least one third block; and transmitting the second information to the at least one third block through the physical connection.

9. The method of claim 7, wherein the first and the second memory have stored therein at least one parameter associated with a respective one of the first and the at least one second block and indicative of a signal propagation capability of the respective first and at least one second block and further wherein transmitting the second information comprises:

querying the first and the second memory to evaluate the at least one parameter and determine therefrom that the first and the at least one second block is provided with bidirectional signal propagation capability;

routing the second information from the given first signal routing block to the given second signal routing block and to the given second port block; and outputting the second information to the at least one third block via the second connection.

10. The method of claim 1, wherein the first block and the at least one second block are provided using one or more elements from graphical environment model library.

11. A system for modeling a physical system in a graphical environment, the physical system encompassing a plurality of physical domains and comprising at least one multi-domain physical component participating in a process of a first one and at least a second one of the plurality of physical domains, the system comprising:

a memory;

a processor; and at least one application stored in the memory and executable by the processor for:

building, using a graphical user interface, a model of the physical system in the graphical environment, comprising:

providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and linking the at least one second block to the first block through one or more signals passing between the first block and the at least one second block to mimic one or more physical connections in the physical system, the first information transmitted from the at least one second block to the first block and second information transmitted from the first block to the one or more third blocks; and executing the model of the physical system to trace system outputs as a function of time.

12. The system of claim 11, wherein the at least one application is executable by the processor for providing the first block comprising:

providing a first subsystem block comprising at least one functional block representative of a mathematical model of the at least one multi-domain physical component, the at least one functional block comprising at least one internal main domain connection port and at least one internal additional domain connection port; and providing at least one first port block, at least one first external connection port each associated with a corresponding one of the at least one first port block, and at least one first signal routing block, each of the at least one first external connection port connected via a first connection to a corresponding one of at least one second external connection port provided for one or more fourth blocks provided at the first hierarchical level and each of the at least one first port block connected to a corresponding one of the at least one main domain connection port and each of the at least one first signal routing block connected to a corresponding one of the at least one additional domain connection port, the first block receiving at the at least one first signal routing block the first information from the at least one second block, receiving at the at least one first port block third information communicated by at least one of the one or more fourth blocks through the first connection, and applying the mathematical model for processing the first and the third information and generating the second information.

13. The system of claim 12, wherein the at least one application is executable by the processor for providing the at least one second subsystem block comprising:

providing a second subsystem block comprising at least one third external connection port, at least one second port block, and at least one second signal routing block, each of the at least one second port block associated with a corresponding one of the at least one third external connection port, each of the at least one second signal routing block connected to a corresponding one of the at least one second port block and having associated therewith a corresponding one of the at least one first signal routing block, and each of the at least one third external connection port connected via a second connection to a corresponding one of at least one fourth external connection port provided for the one or more third blocks, the at least one second block receiving at the at least one second port block the first information communicated by the at least one third block through the second connection.

14. The system of claim 13, wherein the at least one application is executable by the processor for linking the at least one second block to the first block comprising:

for each one of the at least one third external connection port, identifying a given one of the at least one second port block associated therewith;

identifying a given one of the at least one second signal routing block connected to the given second port block;

identifying a given one of the at least one first signal routing block corresponding to the given second signal routing block; and associating, in the memory having stored therein first parameters for the given first signal routing block and second parameters for the given second signal routing block, a unique connection identifier with the first and second parameters for establishing a lineless connection between the given first and second signal routing blocks and causing the given second signal routing block to route the first information to the given first signal routing block.

15. The system of claim 14, wherein the at least one application is executable by the processor for:

providing the first block comprising providing the at least one additional domain connection port comprising at least one additional domain input connection port and at least one additional domain output connection port, providing the at least one first signal routing block comprising at least one first signal receiving block connected to the at least one additional domain input connection port and at least one first signal sending block connected to the at least one additional domain output connection port;

providing the at least one second block comprising providing the at least one third external connection port comprising at least one of at least one input connection port and at least one output connection port, the at least one third block connected to the at least one second block through the at least one input connection port and another one of the one or more third blocks connected to the at least one second block through the at least one output connection port, providing the at least one second port block comprising at least one of at least one second input port block associated with the at least one input connection port and at least one second output port block associated with the at least one output connection port, and providing the at least one second signal routing block comprising at least one second output signal sending block connected to the at least one second input port block and at least one second input signal receiving block connected to the at least one second output port block; and linking the at least one second block to the first block comprises linking the at least one second output signal sending block to the at least one first signal receiving and the at least one second input signal receiving block to the at least one first signal sending block, the first information received at the at least one second block through the at least one second signal receiving block and output to the first block through the at least one second signal sending block and received at the first block through the at least one first signal receiving block, the second information output to the at least one second block through the at least one first signal sending block, received at the at least one second block through the at least one second signal receiving block, and transmitted to the other third block through the at least one second output port block.

16. The system of claim 14, wherein the memory comprises a first memory associated with the first block and a second memory associated with the at least one second block, the at least one application executable by the processor for providing the first block comprising creating a first unique block identifier therefor and storing the first block identifier in the first memory, and for providing the at least one second block comprising creating a second unique block identifier for each of the at least one second block and storing the second block identifier in the second memory, the first and second block identifiers comprising one of a name, a class, and a unique number assigned to a respective one of the first and the at least one second block.

17. The system of claim 16, wherein the at least one application is executable by the processor for one of storing the first block identifier in the second memory and storing the second block identifier in the first memory.

18. The system of claim 17, wherein the first and the second memory have stored therein at least one parameter associated with a respective one of the first and the at least one second block and indicative of a signal propagation capability of the respective first and at least one second block and further wherein the at least one application is executable by the processor for transmitting the second information comprising:

querying the first and the second memory to evaluate the at least one parameter and determine therefrom that at least one of the first and the at least one second block is provided with unidirectional signal propagation capability;

creating at least one internal backward connection port for the first block and connecting each of the at least one internal backward connection port to a signal routing block for backward connection;

establishing a physical connection between the first block and the at least one third block by linking the signal routing block for backward connection of the first block to a corresponding signal routing block for backward connection provided for the at least one third block; and transmitting the second information to the at least one third block through the physical connection.

19. The system of claim 17, wherein the first and the second memory have stored therein at least one parameter associated with a respective one of the first and the at least one second block and indicative of a signal propagation capability of the respective first and at least one second block and further wherein the at least one application is executable by the processor for transmitting the second information comprising:

querying the first and the second memory to evaluate the at least one parameter and determine therefrom that the first and the at least one second block is provided with bidirectional signal propagation capability;

routing the second information from the given first signal routing block to the given second signal routing block and to the given second port block; and outputting the second information to the at least one third block via the second connection.

20. A computer readable medium having stored thereon program code executable by a processor for modeling a physical system in a graphical environment, the physical system encompassing a plurality of physical domains and comprising at least one multi-domain physical component participating in a process of a first one and at least a second one of the plurality of physical domains, the program code executable for:

building, using a graphical user interface, a model of the physical system in the graphical environment, comprising:

providing a first block and at least one second block in a hierarchically-arranged block diagram model representative of the physical system in the graphical environment, the first block representing the at least one multi-domain physical component in a first hierarchical level of the block diagram model and the at least one second block representing the first block in at least one second hierarchical level of the block diagram model, the first hierarchical level modeling the first one of the plurality of physical domains and the at least one second hierarchical level modeling the at least second one of the plurality of physical domains, the at least one second block having connected thereto at least one of one or more third blocks provided at the at least one second hierarchical level and receiving first information therefrom; and linking the at least one second block to the first block through one or more signals passing between the first block and the at least one second block to mimic one or more physical connections in the physical system, the first information transmitted from the at least one second block to the first block and second information transmitted from the first block to the one or more third blocks; and executing the model of the physical system to trace system outputs as a function of time.

\* \* \* \* \*